United States Patent

Sato

[19]

[11] Patent Number: 6,161,056

[45] Date of Patent: Dec. 12, 2000

[54] PLACEMENT METHOD AND APPARATUS

[75] Inventor: Shinji Sato, Kawasaki, Japan

[73] Assignee: Fujitsu Limited, Kawasaki, Japan

[21] Appl. No.: 09/023,048

[22] Filed: Feb. 13, 1998

[30] Foreign Application Priority Data

Apr. 30, 1997 [JP] Japan .................................. 9-112942

[51] Int. Cl.[7] .................................................. G06F 19/00
[52] U.S. Cl. ........................... 700/193; 700/95; 700/97; 700/121; 700/114; 700/160; 29/829; 29/834; 29/838; 716/2; 716/5; 716/7; 716/1
[58] Field of Search .............................. 700/95, 193, 97, 700/121, 117, 160, 114; 29/834, 835, 836, 837, 838, 829; 716/1, 2, 5, 7, 9, 13

[56] References Cited

U.S. PATENT DOCUMENTS

| 4,737,845 | 4/1988 | Susuki et al. | 358/101 |
| 4,979,286 | 12/1990 | Nakayama et al. | 29/740 |
| 5,052,005 | 9/1991 | Tanaka et al. | 372/121 |
| 5,313,401 | 5/1994 | Kasai et al. | 700/160 |
| 5,492,266 | 2/1996 | Hoebener et al. | 228/248.1 |
| 5,631,841 | 5/1997 | Kishida et al. | 395/500.15 |
| 5,691,913 | 11/1997 | Tsuchida et al. | 395/500.09 |
| 5,768,759 | 6/1998 | Hudson | 29/407.04 |

OTHER PUBLICATIONS

S. Sato, "Simulated Quenching: A New Placement Method for Module Generation"; *Proceedings of IEEE International Conference on Computer Aided Design*, Nov. 1997.

S. Chowdhury, "Analytical Approaches to the . . . Placement Problems", *IEEE Transactions on Computer–Aided Design of Integrated Circuits and Systems*, vol. 8, No. 6, Jun. 1989.

S. Zhou et al., "Neighbour State Transition Method for VLSI Optimization Problems", *Proceedings 1993 IEEE International Conference on Computer Design: VLSI In Computers and Processors*, Oct. 1993.

J. Li, et al., "New Spectral Linear Placement and Clustering Approach"; *Proceedings 1996, Las Vegas Convention Center*, pp. 88–93, Jun. 1996.

*Primary Examiner*—Paul P. Gordon
*Assistant Examiner*—R Patel
*Attorney, Agent, or Firm*—Staas & Halsey LLP

[57] ABSTRACT

An area division unit divides a part placement area into a plurality of divided areas based on an area granularity. A part gravity value operation unit and a parts replacement unit extract a set of parts at each end of a connection line for each placement according to a connection line definition table and a parts placement table. If each part belonging to the set of parts obtained in the second process exists in a different divided area for each connection line, then the placement of each part belonging to a divided area is amended in the divided area in such a way that a connection line length between the parts can be shortened. A repetition control unit repeats a series of the above described processes while optionally changing a division starting position of the area division unit. An area granularity change unit repeats the series of the processes up to this point while gradually reducing an area granularity each time the above described series of processes terminate. A termination judgment unit determines the termination of a process, and outputs the position of a part as an output result from the parts placement table.

13 Claims, 35 Drawing Sheets

| CONNECTION LINE NUMBER | PARTS LIST | WEIGHT |
| --- | --- | --- |
| 1 | A, D, H | 1 |
| 2 | A, C, G | 1 |
| 3 | B, E | 1 |
| 4 | C, H | 1 |
| 5 | D, F | 1 |
| 6 | A, E, F | 1 |
| 7 | B, G | 1 |

FIG. 5

| PLACEMENT NUMBER | PART NUMBER | GRAVITY VALUE | AREA NUMBER |
|---|---|---|---|
| 1 | A | — | — |
| 2 | B | — | — |
| 3 | C | — | — |
| 4 | D | — | — |
| 5 | E | — | — |
| 6 | F | — | — |
| 7 | G | — | — |
| 8 | H | — | — |

FIG. 6

| PLACEMENT NUMBER | PART NUMBER | GRAVITY VALUE | AREA NUMBER |
|---|---|---|---|
| 1 | A | +3 | 1 |
| 2 | B | +2 | 1 |
| 3 | C | 0 | 2 |
| 4 | D | 0 | 2 |
| 5 | E | −1 | 2 |
| 6 | F | −1 | 2 |
| 7 | G | −2 | 2 |
| 8 | H | −1 | 2 |

FIG. 8

| PLACEMENT NUMBER | PART NUMBER | GRAVITY VALUE | AREA NUMBER |
|---|---|---|---|
| 1 | B | 0 | 1 |
| 2 | A | +2 | 1 |
| 3 | G | 0 | 1 |
| 4 | E | 0 | 1 |
| 5 | F | +1 | 1 |
| 6 | H | 0 | 2 |
| 7 | C | -1 | 2 |
| 8 | D | -2 | 2 |

FIG. 12

| PLACEMENT NUMBER | PART NUMBER | GRAVITY VALUE | AREA NUMBER |
|---|---|---|---|
| 1 | B | +1 | 1 |
| 2 | G | +1 | 1 |
| 3 | E | −1 | 2 |
| 4 | F | 0 | 2 |
| 5 | A | +1 | 2 |
| 6 | D | 0 | 2 |
| 7 | C | −1 | 3 |
| 8 | H | −1 | 3 |

FIG. 14

| PLACEMENT NUMBER | PART NUMBER | GRAVITY VALUE | AREA NUMBER |
|---|---|---|---|
| 1 | B | 0 | 1 |
| 2 | G | +1 | 1 |
| 3 | E | +1 | 1 |
| 4 | F | +1 | 1 |
| 5 | D | −1 | 2 |
| 6 | A | −1 | 2 |
| 7 | C | −1 | 2 |
| 8 | H | 0 | 2 |

FIG. 16

| PLACEMENT NUMBER | PART NUMBER | GRAVITY VALUE | AREA NUMBER |
|---|---|---|---|
| 1 | B | +1 | 1 |
| 2 | G | +1 | 1 |
| 3 | E | 0 | 2 |
| 4 | F | 0 | 2 |
| 5 | D | +1 | 2 |
| 6 | A | −1 | 3 |
| 7 | C | 0 | 3 |
| 8 | H | −2 | 4 |

FIG. 18

| PLACEMENT NUMBER | PART NUMBER | GRAVITY VALUE | AREA NUMBER |
|---|---|---|---|
| 1 | B | +2 | 1 |
| 2 | G | 0 | 2 |
| 3 | E | 0 | 2 |
| 4 | F | +1 | 2 |
| 5 | D | 0 | 3 |
| 6 | A | −1 | 3 |
| 7 | C | 0 | 3 |
| 8 | H | −2 | 4 |

FIG. 20

| PLACEMENT NUMBER | PART NUMBER | GRAVITY VALUE | AREA NUMBER |
|---|---|---|---|
| 1 | B | +2 | 1 |
| 2 | G | 0 | 2 |
| 3 | E | 0 | 2 |
| 4 | F | +1 | 3 |
| 5 | A | 0 | 4 |
| 6 | D | −1 | 4 |
| 7 | C | 0 | 5 |
| 8 | H | −2 | 6 |

FIG. 22

| PLACEMENT NUMBER | PART NUMBER | GRAVITY VALUE | AREA NUMBER |
|---|---|---|---|
| 1 | B | +1 | 1 |
| 2 | G | +1 | 1 |
| 3 | E | 0 | 2 |
| 4 | F | 0 | 3 |
| 5 | D | +1 | 3 |
| 6 | A | −1 | 4 |
| 7 | C | −1 | 5 |
| 8 | H | −1 | 5 |

FIG. 24

| PLACEMENT NUMBER | PART NUMBER | GRAVITY VALUE | AREA NUMBER |
|---|---|---|---|
| 1 | B | – | – |
| 2 | G | – | – |
| 3 | E | – | – |
| 4 | F | – | – |
| 5 | D | – | – |
| 6 | A | – | – |
| 7 | C | – | – |
| 8 | H | – | – |

| REPLACEMENT k | FIRST | SECOND | THIRD | FOURTH | FIFTH | SIXTH | SEVENTH | EIGHTH |
|---|---|---|---|---|---|---|---|---|
| | 8.0 | 8.0 | 4.8 | 4.8 | 2.8 | 2.8 | 1.6 | 1.6 |
| TOTAL LINE LENGTH | 33 | 23 | 16 | 16 | 16 | 16 | 16 | 16 | 16 |

× DOCUMENT 1   New Spectral Linear Placement and Clustering Approach 33rd Design Automation Conference 1996

STEP 1

PARTS HAVING SMALLER VALUES OF x_value IN ORDER AS SHOWN LEFT

STEP 2

PARTS HAVING SMALLER VALUES OF y- VALUE IN ORDER AS SHOWN RIGHT IN EACH SUBAREA

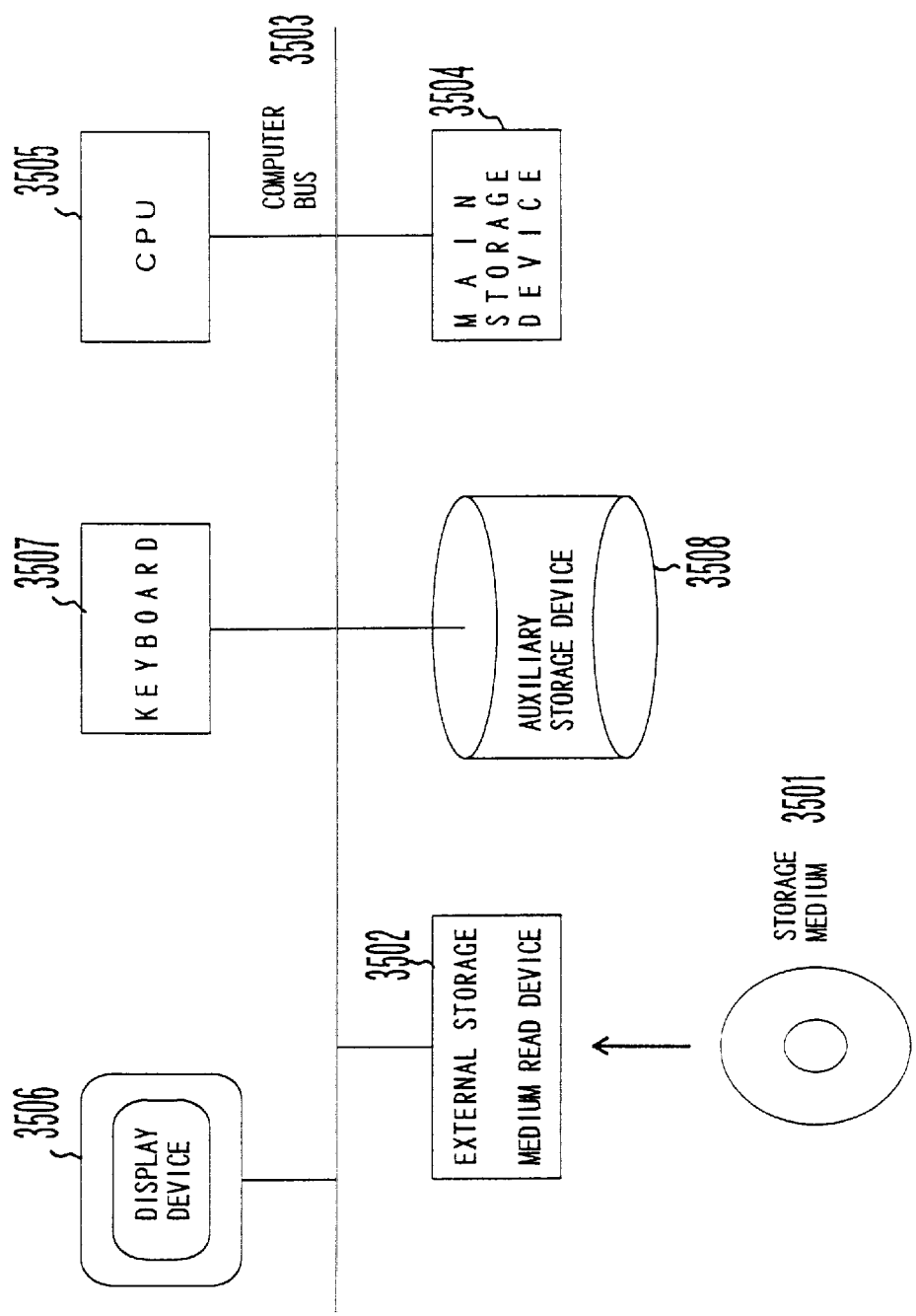
F I G. 35

PLACEMENT METHOD AND APPARATUS

BACKGROUND OF THE INVENTION

1. Field of the Invention

The present invention relates to an automatic placement technology in the technological field such as a semiconductor integrated circuit technology, etc. in which the optimum performance of a composed system substantially depends on the placement of its parts and components.

2. Description of the Related Art

Normally, the shorter the interconnecting connection lines between the parts forming a semiconductor integrated circuit are, the higher the operation speed becomes and the smaller the consumption of electric power becomes. Therefore, in designing a semiconductor integrated circuit, great effort is made to minimize a total circuit connection line length.

The conventional methods of minimizing the total circuit connection line length are the simulated annealing (SA) method and the spectral method.

Conventional Technology: SA Method

First, the SA method is a conventional technology of applying the energy status analysis principle from the field of statistical thermodynamics to the minimization of the required total circuit connection line length. The SA method is disclosed by D. F. Wong, H. W. Leong, and C. L. Liu 'Simulated Annealing for VLSI Design', Kluwer Academic Publishers.

To shorten the total circuit connection line length, optional two parts i and j are normally selected from among all the parts forming the circuit. When the positions of the selected parts are exchanged for each other and if the exchange results in a shorter total circuit connection line length, then the exchange is actually made. These steps are repeated for the other circuit parts. However, since there are plural sets of connection lines connecting parts of a circuit, an exchange of some parts may shorten a connection line associated with those parts but may lengthen another connection line associated with other parts. Therefore, even if a total circuit connection line length appears shorter after sequentially repeating the selection and the exchange of the parts according to a predetermined rule, it still does not guarantee the shortest connection line length. This indicates that the minimization problem for a total circuit connection line length is an optimization problem in a multi-dimensional space, and it is probable that the above described result only refers to a local optimization solution.

The SA method provides the following solution to the above described circuit connection line-length minimization problem.

As for the transition of the energy of a substance, energy normally flows from a high toward a lower level. Therefore, when the energy of a substance is changing from one energy level E1 to another energy level E2, the transition occurs without fail if E1 is larger than E2 (E1>E2). If E1 is smaller than E2 (E1<E2), then the transition normally does not occur. However, if the temperature T of the substance is high, then the molecules forming the substance move actively. Therefore, there is a probability that the transition from E1 to E2 may occur even if E1 is smaller than E2 (E1<E2). With the above described probability of transition, the energy of a substance may temporarily enter a local optimum solution state, but can leave this state and converge on the optimum balanced state (hill climbing method) in which the true minimum value for the current temperature T is obtained. If the energy of the substance converges to a balanced state at a specific temperature T and the temperature T drops a little, then the energy of the substance can converge to a new optimum balanced state in which a further minimum value for the new temperature T is obtained. Thus, if the temperature T gradually drops, the energy of a substance can converge to the optimum balanced state in which a true minimum value for an object temperature T can be obtained.

In statistical thermodynamics, when a first energy E1 is changing into a second energy E2 at a specific temperature T, the probability h that a transition may occur when E1<E2 can be computed by the following equation (1).

$$h = \exp(-(E2-E1))/(kT)) \tag{1}$$

where k indicates a constant.

In the SA method, the solution to the transition problem of the above described energy status is applied to the circuit connection line length minimization problem.

That is, the concept of the temperature T is adopted in the SA method, and probable parts exchanging operations are repeated while the temperature T drops from a higher level to a lower level. To be more practical, the following operations are sequentially performed. Regardless of the actual temperature, the temperature T indicates a concept of an amount adopted to reduce in the proceeding of the processes the probability that an exchanging operation is actually performed when a total connection line length increases by exchanging parts.

Step 1

The initial temperature T is determined.

Step 2

Two optional parts i and j are selected at random from among the parts forming the circuit.

Step 3

The change d in total circuit connection line length after exchanging parts i and j is computed.

Step 4

If d≦0, the above described exchange is performed.

Step 5

If d>0, the probability h is computed by the following equation (2) based on the equation (1) above.

$$h = \exp(-d/(kT)) \tag{2}$$

A random number r is obtained within a range from 0 to 1. If r≦h, the above described exchange is performed. If r>h, the exchange is not performed.

Step 6

After the processes in steps 2 through 5 are repeated a sufficient number of times, the temperature T is dropped a little, and the processes in steps 2 through 5 are repeated again a sufficient number of times.

Step 7

When the temperature T drops to a predetermined level, the above described repetitive processes are stopped and the total connection line length at the stop point is output as a result.

Thus, when the temperature T is high in the SA method, there is a strong probability that parts are exchanged even if the exchanging operation requires a longer connection line length, because most of the positions of the parts in a circuit have not been optimized when processes have just started. There is also a strong possibility that the placement of the parts is set as the local optimum solution, and there should be the largest possible number of opportunities to set the placement of the parts away from the local optimum solution (hill climbing method). When the processes proceed and the temperature T becomes low, the placement of the parts in the circuit reaches an optimum status, and there is little possibility that the placement of the parts reaches the local optimum solution. Therefore, if the total connection line length becomes longer after exchanging parts, the system operates in such a way that the exchanging operation is not actually performed. Thus, in the SA method, the total connection line length can be optimally set to the minimum length.

However, since the above described SA method is based on a 2-parts exchange for a position change, a solution slowly improves, and the entire process requires a long time. Furthermore, a total connection line length should be computed in processes for exchanging all parts, and an operation should be performed using an exponent to compute probability in the exchanging processes for many parts. These processes also require a long time.

Therefore, the SA method requires an impractically long process time when there are a large number of parts in a circuit, such as in the latest semiconductor integrated circuits, etc.

Spectral Method

First, a one-dimensional placement is assumed for a simpler process. That is, it is assumed that the parts are arranged in a connection line.

In this case, the placement of each part can be expressed as one permutation, and can be expressed by a vector $\underline{X}$ which is represented by the following equation (3) and has a one-dimensional coordinate of each part as an element. In the following explanation, an underlined character indicates a vector.

$$\underline{X}=(x1, x2, \ldots, xi, \ldots, xn) \quad (3)$$

The spectral method aims at obtaining the placement of parts, namely calculating the vector $\underline{X}$, in such a way that the circuit has the shortest possible connection line length. The positions of parts are normally expressed by natural numbers, but an element xi of the vector $\underline{X}$ corresponding to the position of each part can be assumed to be a real number. This indicates that parts can be located at the same position and the resultant placement may be impractical. However, the element xi can be a real number to easily obtain a model.

Assume that weight aij is assigned corresponding to the importance of a connection line between a part i and a part j. In this case, the total circuit connection line length minimization problem is equivalent to the problem of minimizing the value of the following equation (4).

$$\sum_{i>j}\sum_{j} aij|xi - xj| \quad (4)$$

On the other hand, the following equation (6) is expressed based on a matrix [M] containing the values i and j ($1 \leq i \leq n$, $1 \leq j \leq n$) and the equation (3) above. In the following explanation, a character enclosed by '[' and ']' indicates a matrix.

$$\begin{array}{l} -aij' \ldots \text{when } i \neq j \\ \sum_{j} aij' \ldots \text{when } i = j \end{array} \quad (5)$$

$$\underline{X}^T[M]\underline{X} = \sum_{i>j}\sum_{j} aij'(xi-xj)^2 \quad (6)$$

where vector $\underline{X}^T$ indicates a transposed vector $\underline{X}$.

When the right-hand-side of the equation (6) is compared with the equation (4), the connection line length for the parts i and j is squared in the equation (6). In consideration of this difference, the circuit connection line length minimization problem is solved as a problem of computing the vector $\underline{X}$ for minimizing the equation (6) in the spectral method.

Assuming that an eigenvalue of the matrix [M] is λ and the proper vector for the eigenvalue λ is $\underline{X}$, the following equation (7) is expressed.

$$[M]\underline{X}=\lambda\underline{X} \quad (7)$$

By multiplying each item by $\underline{X}^T$ from the left to the right in each side, the following equation (8) is expressed.

$$\underline{X}^T[M]\underline{X}=\underline{X}^T\lambda\underline{X}=\lambda\underline{X}^T\underline{X}=\lambda \quad (8)$$

Therefore, to compute the vector $\underline{X}$ or minimizing the equation (6), the minimum eigenvalue λmin for the matrix [M] and other than 0 is first computed, then the eigenvector $\underline{X}$min for the minimum eigenvalue λmin is computed, and the result is set as a vector $\underline{X}$.

Thus, the vector $\underline{X}$ for minimizing the equation (6) is computed. Since the value obtained by squaring the connection line length for the parts i and j is used as described above, computing the vector $\underline{X}$ for minimizing the equation (6) does not refer to minimizing the total circuit connection line length when the squared value is used as it is.

In the spectral method, using the predetermined weight aij of the connection line between the part i and the part j and the initial connection line lengths xi and xj between the parts i and j according to the equation (9) obtained from the equations (4) and (6), the element value aij' of the matrix [M] is computed.

$$aij|xi-xj|=aij'(xi-xj)^2$$

∴

$$aij'=aij/|xi-xj| \quad (9)$$

Using the matrix [M] determined from the element value aij', the minimum eigenvalue λmin other than 0 for the matrix [M] is computed, and the eigenvector $\underline{X}$min for the minimum eigenvalue λmin is computed as the vector $\underline{X}$ for minimizing the equation (6).

A new element value aij' of the matrix [M] is computed using new connection line lengths xi and xj between the parts i and j provided by the computed vector $\underline{X}$ and the predetermined weight aij of the connection line between the parts i and j. Based on the computed value, a subsequent vector $\underline{X}$ is computed. Thus, the processes are repeated.

In the spectral method, the placement of parts with which the total circuit connection line length can be the optimum and minimum value in approximation, that is, the vector $\underline{X}$, is computed by repeating the above described matrix operations.

In the spectral method, it is required to compute the minimum eigenvalue λmin other than 0 and a corresponding eigenvector $\underline{X}$min. If the number of parts increases and the number of dimensions of a matrix also increases, the process time is extended and the computation precision is dramatically lowered. Therefore, a method of reducing the number of dimensions of a matrix has recently been suggested by clustering parts originally related to each other into one part group.

However, since an integer indicating the position of parts is extended to a real number to perform the total circuit connection line length minimizing process in the spectral method, it is not certain that the minimization can be realized for the optimum total circuit connection line length.

When the number of parts is very large as in the case of recent semiconductor integrated circuits, the computation of a proper vector requires a long time with an increase in computation error.

Furthermore, in the spectral method, a nonlinear converting process is performed between the actual connection line length and a squared connection line length as described above using the equation (9). Therefore, there is the problem that the solution space is not smooth as shown in FIG. 1, and that there is a strong probability that the placement of the parts can enter a status of a local optimum solution.

The problems with the above described SA method and spectral method are not limited to the total circuit connection line length minimization problem. For example, a schedule optimization problem occurring when the optimum scheduling is performed between, for example, a plurality of actions, can also be considered.

SUMMARY OF THE INVENTION

The present invention has been developed based on the above described background, and aims at realizing an automatic placement technology of the parts or components with a practical process speed and precision.

The first aspect of the present invention is based on the method of placing a plurality of components in such a way that the cost for connecting the components can be minimized.

In the first process, an area in which components are arranged is divided into a plurality of regularly divided areas based on an area granularity value.

In the second process, a set of components at each terminal of a connection line are extracted for each connection line.

In the third process, if each component belonging to the set of components obtained in the second process exists in a different divided area for each connection, then the placement of each component belonging to a divided area is amended in the divided area in such a way that a connection cost between the components can be reduced.

In the fourth process, the first through third processes are repeated with the dividing position in the first process amended at random without changing the area granularity value.

In the fifth process, the first through fourth processes are repeated with the area granularity value changed in such a way that a predetermined value can gradually become smaller than a predetermined initial value each time a series of repetitive control processes terminate in the fourth process.

In the sixth process, the placement of the components as set when the series of repetitive control processes in the fifth process terminate is output as an output result.

With the above described configuration according to the first aspect of the present invention, the automatic placement of component, which has been difficult using the conventional technology because of the time restriction and lack of precision, can be successfully realized in a reasonable time.

The second aspect of the present invention is based on a method of placing a plurality of parts in a circuit such as a semiconductor integrated circuit, etc. in such a way that the connection line length between the parts can be minimized.

In the first process, an area in which parts are arranged is divided into a plurality of regularly divided areas based on an area granularity value.

In the second process, a set of parts at each terminal of a connection line are extracted for each connection line.

In the third process, if each part belonging to the set of parts obtained in the second process exists in a different divided area for each connection line, then the placement of each part belonging to a divided area is amended in the divided area in such a way that a connection line length between the parts can be shortened. For example, if each part belonging to the set of parts obtained in the second process exists in a different divided area for each connection line, then the third process includes for each of the parts a process of accumulating a gravity value having a value corresponding to the position of each part in the placement of a set of parts to which each part belongs, and having a value corresponding to the weight preliminarily assigned to the placement; and a process of amending in a divided area the position of each part belonging to the divided area based on the gravity value accumulated for each part.

In the fourth process, the first through the third processes are repeatedly performed without changing the area granularity value while a division starting position in the first process is amended at random.

In the fifth process, each time a series of repetitive control processes in the fourth process terminate, the first through fourth processes are repeatedly performed while the area granularity value is amended in such a way that the value gradually becomes smaller than a predetermined initial value.

In the sixth process, the placement of parts at the point when a series of repetitive control processes in the fifth process terminate is output as an output result.

With the above described configuration according to the second aspect of the present invention, the automatic placement of components, which has been difficult using the conventional technology because of the time restriction and lack of precision, can be successfully realized in a reasonable time. Especially, high-precision and high-speed automatic placement and division can be realized in an integrated circuit, thereby improving the operation speed, area, power consumption, etc. of an integrated circuit.

The present invention also discloses a placing apparatus having a function that can be realized by the above described configuration; and a computer-readable storage medium storing a program having an equivalent function.

BRIEF DESCRIPTION OF THE DRAWINGS

Further objects and features of the present invention can be easily recognized by one of ordinary skill in the art by referring to the attached drawings and the descriptions of the preferred embodiments of the present invention.

In the attached drawings,

FIG. 5 shows a configuration of a connection line definition table;

FIG. 6 shows a status (1) (initial status) of a parts placement table;

FIG. 8 shows a status (2) of a parts placement table;

FIG. 12 shows a status (3) of a parts placement table;

FIG. 14 shows a status (4) of a parts placement table;

FIG. 16 shows a status (5) of a parts placement table;

FIG. 18 shows a status (6) of a parts placement table;

FIG. 20 shows a status (7) of a parts placement table;

FIG. 22 shows a status (8) of a parts placement table;

FIG. 24 shows a status (9) of a parts placement table;

FIG. 26 shows a status (10) of a parts placement table;

FIG. 27 shows the relationship among the number of rearranging operations, the area granularity k, and a total connection line length shown in FIGS. 7 and 8, and 12 through 25;

FIG. 35 shows the computer system to which each embodiment of the present invention is applied.

DESCRIPTION OF THE PREFERRED EMBODIMENTS

Each of the embodiments of the present invention is described below in detail by referring to the attached drawings.

First Embodiment of the Present Invention

The first embodiment of the present invention is based on a one-dimensional placement of parts. That is, it is assumed that parts are arranged in a connection line.

Figure 1:
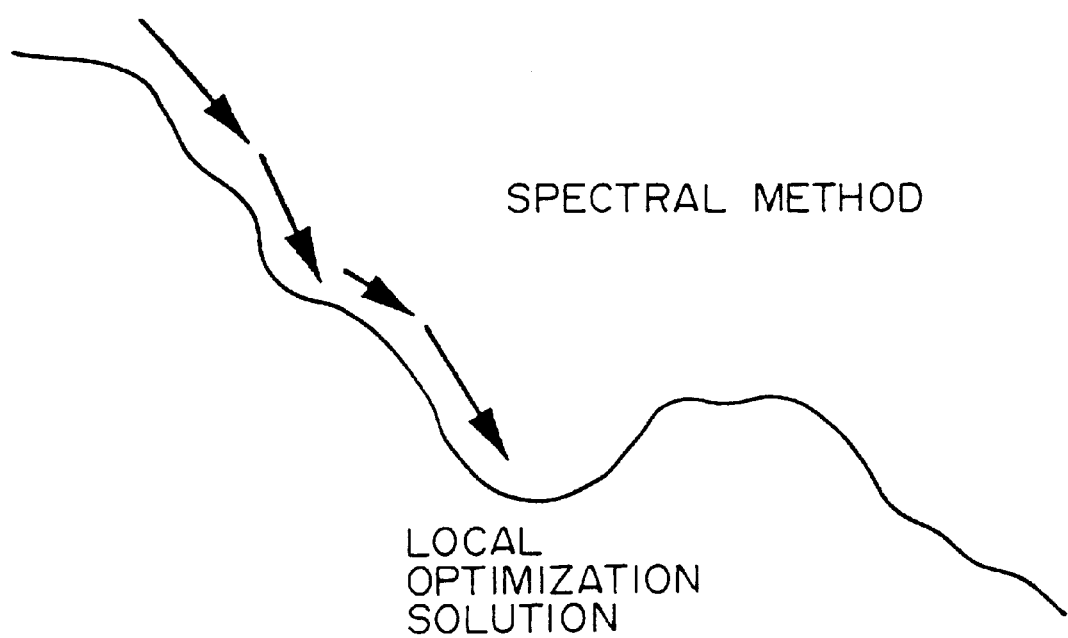
FIG. 1 shows the problem with the spectral method.
Figure 2:
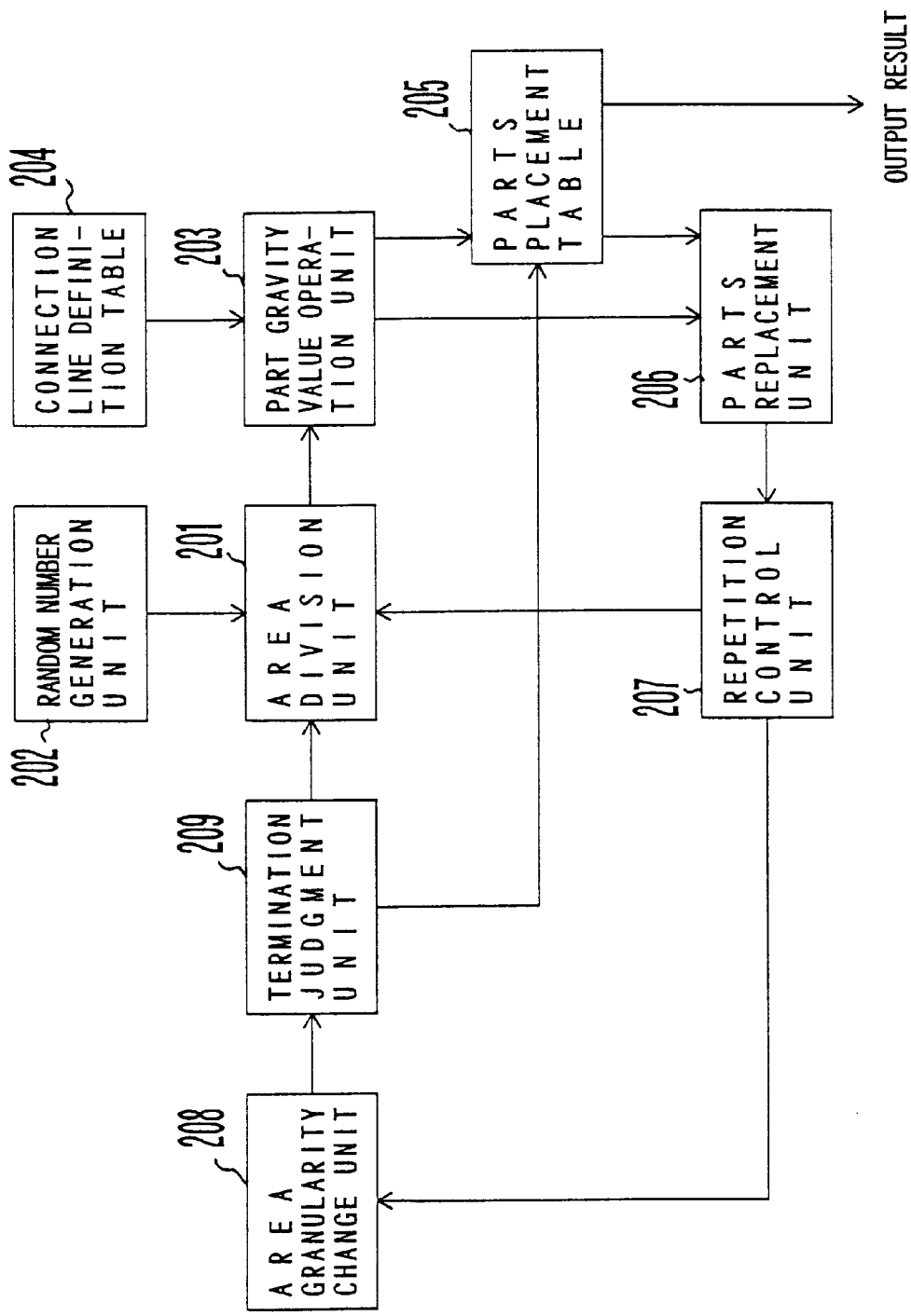
FIG. 2 shows the configuration according to an embodiment of the present invention.
Figure 3:
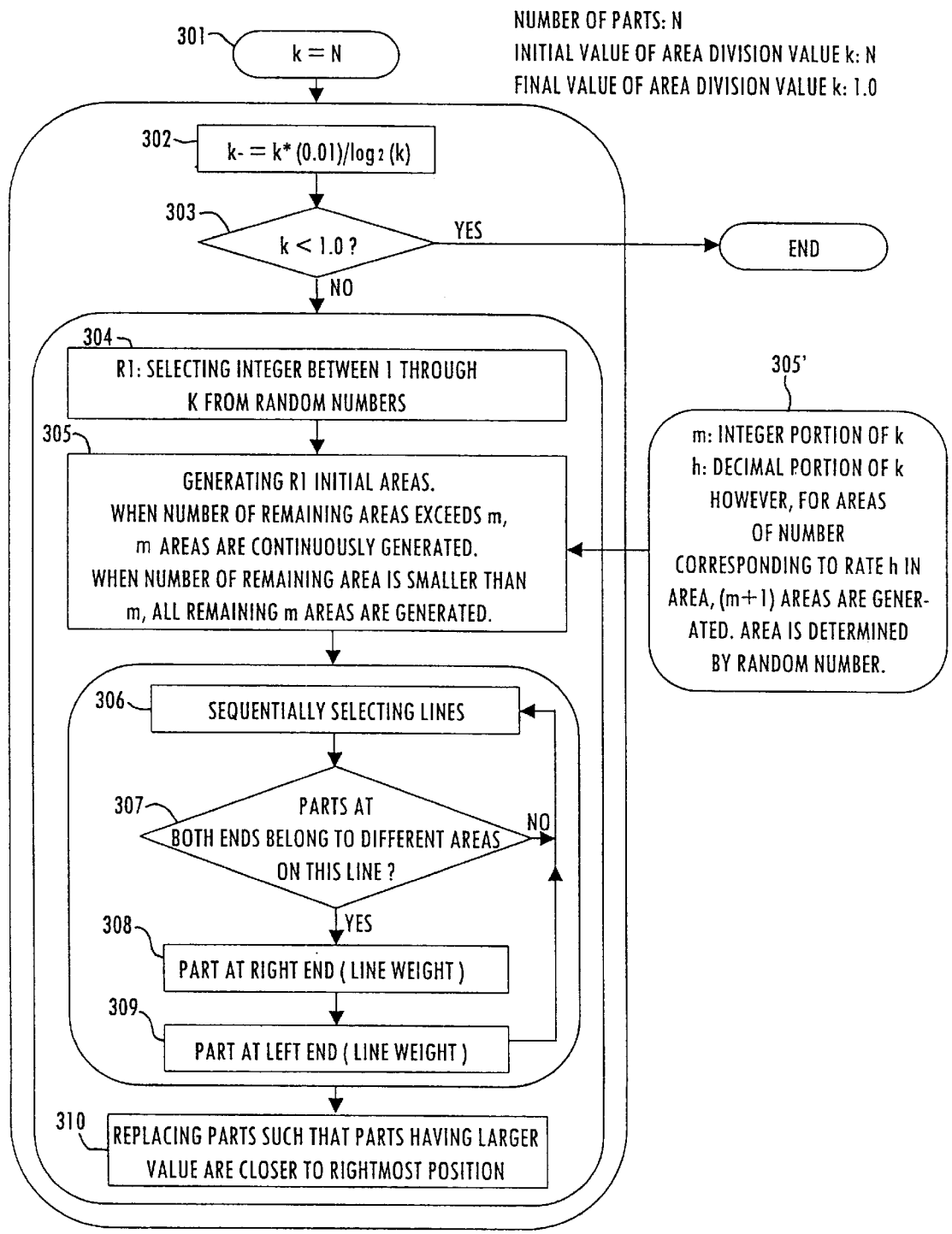
FIG. 3 is a flowchart showing the operation according to the first embodiment of the present invention.

FIG. 2 shows a configuration according to the first embodiment of the present invention. FIG. 3 is a flowchart showing the function according to the first embodiment of the present invention realized with the configuration shown in FIG. 2.

In FIG. 2, an area division unit 201 is realized as a function performed by a CPU of a computer by executing a predetermined program stored in a storage device. An area having parts arranged at each point is divided into a plurality of areas according to a parameter k sequentially reduced in value from a predetermined initial value (set to k=N in step 301 in FIG. 3) (step 305 in FIG. 3).

Figure 4:
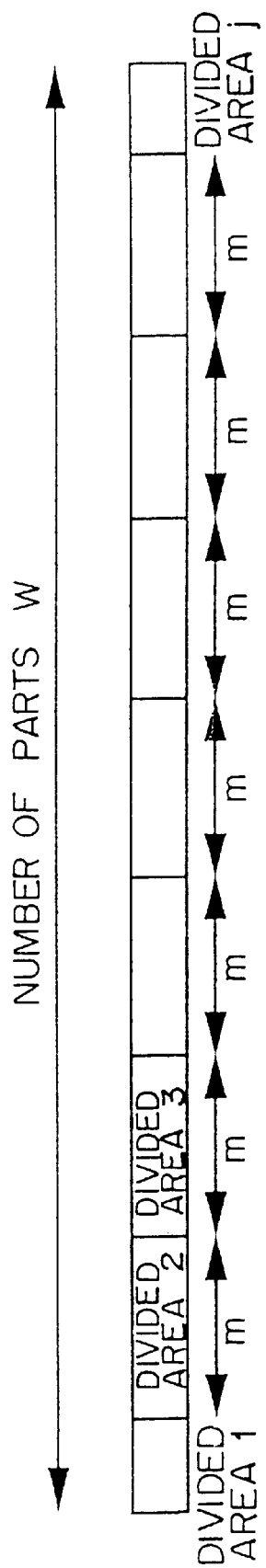
FIG. 4 shows a process of dividing an area according to the first embodiment of the present invention.

According to the first embodiment of the present invention, W parts arranged in one dimension at equal intervals as shown in FIG. 4 are divided into m-part units. A real number parameter k having the number m of the divided parts as an integer portion is referred to as area granularity. There are a plurality of cases of dividing the parts into m units. Since the division depends on the number of parts in the first divided area in each case, the area division unit 201 determines the number of parts R1 ($1 \leq R1 \leq m$) in the first divided area 1 (step 304 in FIG. 3) according to the random number generated by a random number generation unit 202. Additionally, since the area granularity k can be a real number, divided areas containing m parts co-exist with divided areas containing m+1 parts at a rate depending on the value h of the decimal portion of the area granularity k. A decision on which divided area is assigned m+1 parts depends on a random number generated by the random number generation unit 202 (step 305' shown in FIG. 3). The random number generation unit 202 is realized as a function performed by the CPU of the computer by executing a predetermined program stored in the storage device.

Next, as shown in FIG. 5, a connection line number, a list of part numbers for the parts to which the connection line is connected, and a weight of the connection line are preliminarily set for each connection line in a connection line definition table 204 shown in FIG. 2. As in the spectral method, the weight is a parameter indicating at what importance level the connection line corresponding to the weight should be shortened. In the example shown in FIG. 5, the weight is set to 1 for all connection lines. The connection line definition table 204 is stored in, for example, a hard disk storage device or a main storage device of a computer.

Then, as shown in FIG. 6, a placement number indicating the position where a part is positioned in an entire area; a part number which is an identifier of the part; a gravity value computed for the part by a part gravity value operation unit 203 described later; and an area number indicating which area of a plurality of divided areas obtained by the area division unit 201 the part belongs to are set in a parts placement table 205 shown in FIG. 2 at each point in time for each part. FIG. 6 shows an example of the initial status of the parts placement table 205 according to the first embodiment of the present invention. No gravity values or area numbers have been set yet in this table. The parts placement table 205 is stored in, for example, a hard disk storage device or a main storage device in a computer.

According to the first embodiment of the present invention, the placement number in the parts placement table 205 is a one-dimensional value specifying the position of a part in the one-dimensional area shown in FIG. 4. The placement numbers are arranged in ascending order from left to right in a one-dimensional area. That is, the largest placement number is arranged at the rightmost position of the one-dimensional area.

A gravity value in the parts placement table 205 indicates in which direction and a distance value, in a divided area containing a part entered in the table, the part should be moved. According to the first embodiment of the present invention, a divided area is one-dimensional, and therefore a gravity value is a one-dimensional value.

Figure 7:
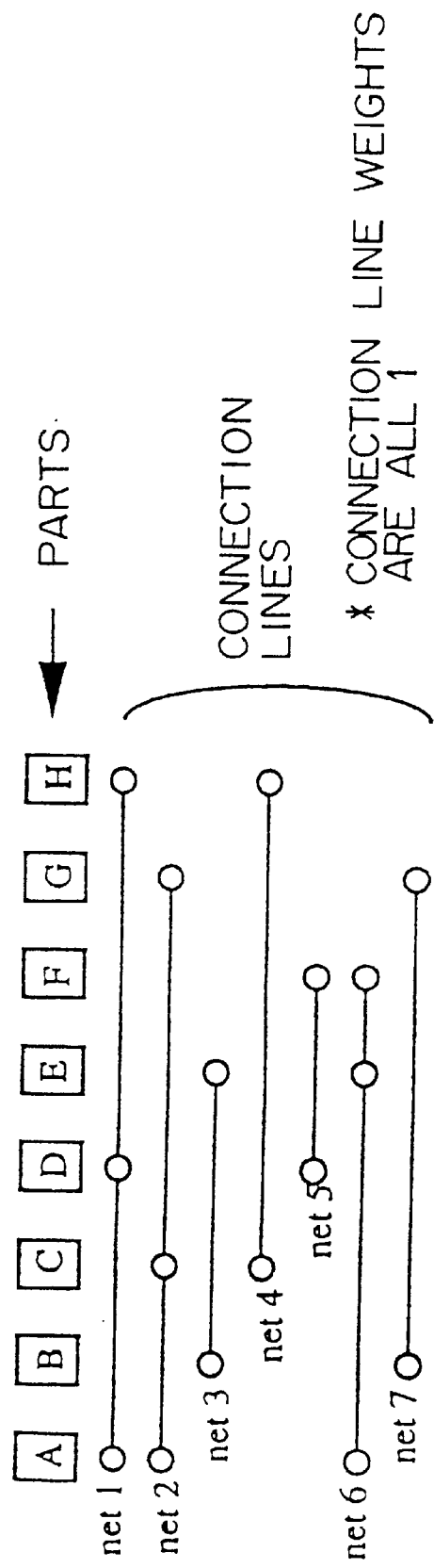
FIG. 7 shows a status (1) (initial status) diagram of parts placement.

FIG. 7 shows an image of the initial status of the placement of parts A through H indicated by the contents of the parts placement table 205 shown in FIG. 6. FIG. 7 also shows connection lines 1 through 7 as net 1 through net 7 corresponding to the placement numbers 1 through 7 preliminarily defined by the connection line definition table 204 shown in FIG. 5.

When the area division unit 201 shown in FIG. 2 divides an area based on the above described area granularity k into a plurality of divided areas, it specifies using an area number indicating a divided area an area of the divided areas to which a part arranged in each placement number in the entire area belongs, and writes the area number to the parts placement table 205.

For example, in the initial status of the parts placement table 205 shown in FIG. 6 and the initial status of the parts placement image shown in FIG. 7 or 9A, the area division unit 201 performs the following processes.

First, assuming that the initial value of the area granularity k is 8.0 and the number of parts (8) is divided by the integer portion m=8 of the area granularity k, the result of the division is 1. Therefore, the entire area can be divided into 2 divided areas at maximum, obtained by adding 1 to the division result.

Figure 9:
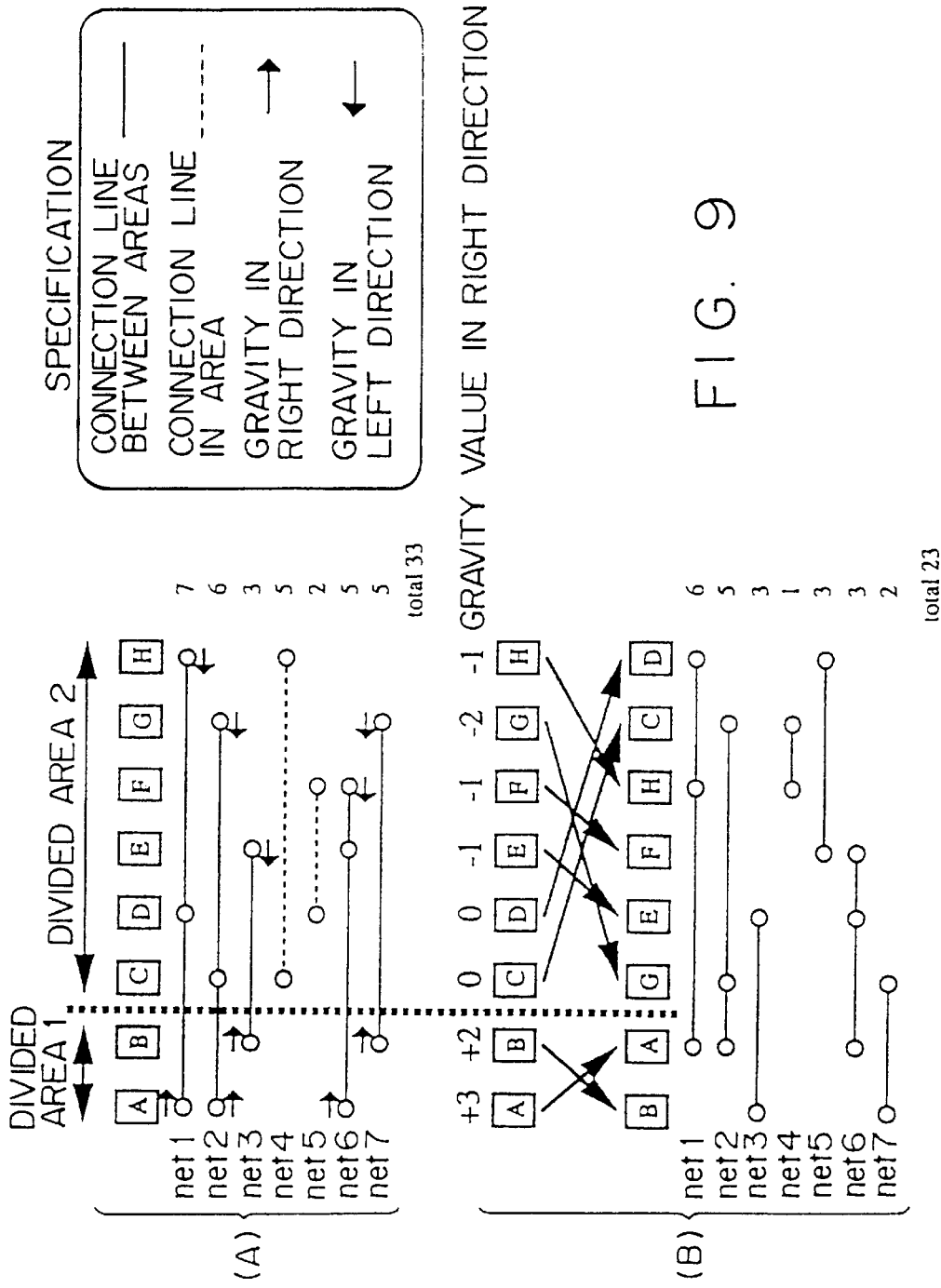
FIG. 9 show a diagram of a status change (1 to 2) of parts placement.

The area division unit 201 generates a divided area 1 as described below. That is, the area division unit 201 selects an integer according to a random number generated by the random number generation unit 202 from the integers 1 through 8 determined by the integer portion m=8 of the area granularity k. Assuming that the selected integer is R1=2, the area division unit 201 selects a real number in the range from 0 to 1.0 according to a random number generated by the random number generation unit 202. If the random number is 0.5, it is larger than the decimal portion h=0.0 of the area granularity k. Therefore, the area division unit 201 generates the divided area 1 having the size R1=2 as shown in FIG. 9. Practically, the area division unit 201 sets the area numbers of the placement numbers 1 and 2 in the parts placement table 205 to 1 as shown in FIG. 8. As a result, the number of parts contained in the remaining areas is 6.

The area division unit 201 generates a divided area 2 as follows. That is, the area division unit 201 selects one real number in the range from 0 through 1.0 based on a random number generated by the random number generation unit 202. Assuming that the selected random number is 0.7, the random number 0.7 is larger than the decimal portion h=0.0 of the area granularity k. Therefore, the area division unit 201 tries to generate a divided area 2 having the integer portion m=8 of the area granularity k. However, the number of remaining parts is 6, and the area division unit 201 generates a divided area 2 having the size of 6 as shown in FIG. 9. Practically, the area division unit 201 sets each of the area numbers of the placement numbers 3 through 8 to 2 as shown in FIG. 8.

Next, the part gravity value operation unit 203 shown in FIG. 2 is realized as a function performed by the CPU of a computer by executing a predetermined program stored in the storage device, and extracts a plurality of part numbers corresponding to the parts positioned at the respective ends of the connection line having the connection line number entered in the connection line definition table 204 shown in FIG. 5 from the part numbers in the parts list corresponding to the connection line number (repeating the steps 306 through 309 shown in FIG. 3).

Practically, according to the first embodiment of the present invention, the part gravity value operation unit 203 retrieves from the parts placement table 205 the placement number of each part number in the parts list corresponding to the connection line number entered in the connection line definition table 204, extracts two part numbers having the smallest placement number and the largest placement number, and thereby extracts two part numbers corresponding to the parts positioned at both ends of the connection line.

Figure 10:
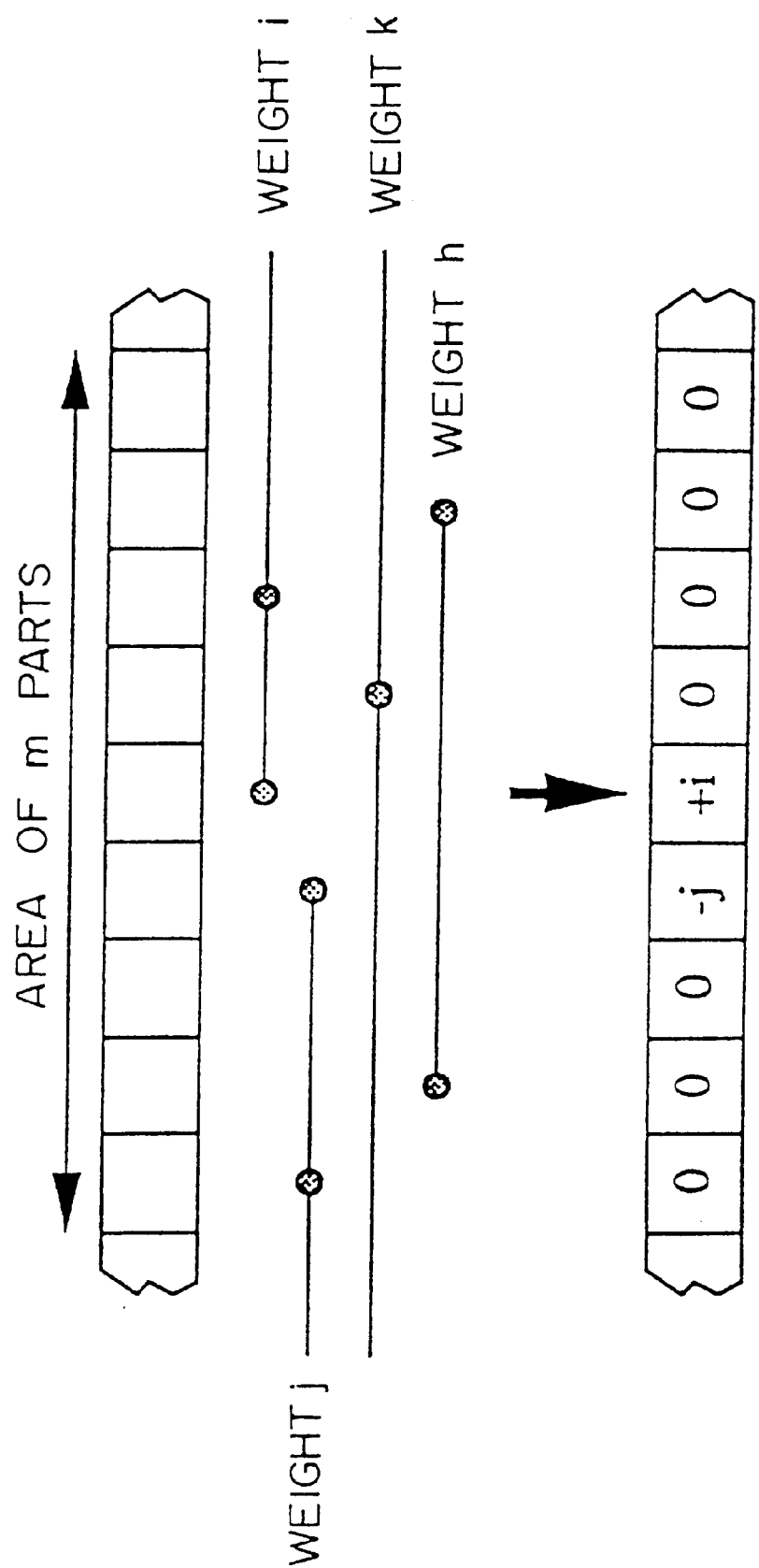
FIG. 10 shows the process of computing a gravity value.

Then, the part gravity value operation unit 203 accumulates a new gravity value to the entered gravity value only when two entries in the parts placement table 205 corresponding to the part numbers at the above described ends of the connection line have different area numbers (steps 307 through 309 shown in FIG. 3). In this case, for example, the part gravity value operation unit 203 accumulates a positive gravity value +i corresponding to the weight i for the connection line being processed as an absolute value to the gravity value in the entry of the parts placement table 205 corresponding to the part number at the leftmost end as shown in FIG. 10 (step 309 shown in FIG. 3). The part gravity value operation unit 203 accumulates a negative gravity value −j corresponding to the weight j for the connection line being processed as an absolute value to the gravity value in the entry of the parts placement table 205 corresponding to the part number at the rightmost end (step 308 shown in FIG. 3). The weight for the connection line currently being processed can be obtained from the connection line definition table 204.

To be more concrete, according to the first embodiment of the present invention, the part gravity value operation unit 203 accumulates a positive gravity value having an absolute value corresponding to the weight of the current connection line to a gravity value in the entry of the parts placement table 205 corresponding to the part number having the smallest placement number, and accumulates a negative gravity value having an absolute value corresponding to the weight of the current connection line to a gravity value in the entry of the parts placement table 205 corresponding to the part number having the largest placement number.

For example, in the initial status of the parts placement table 205 shown in FIG. 6 or in the initial status diagram of the parts placement shown in FIG. 7 or 9A, the part gravity value operation unit 203 retrieves from the parts placement table 205 the placement number of each part number in the parts lists A, D, and H for a connection line 1 (net1) in the connection line definition table 204, and extracts the part number A having the smallest placement number 1 and the part number H having the largest placement number 8. Since different area numbers are set in the entries for the two part numbers A and H in the parts placement table 205 as shown in FIG. 8, the part gravity value operation unit 203 accumulates a positive gravity value +1 to a gravity value of the entry in the parts placement table 205 corresponding to the part number A having the smallest placement number 1, and accumulates a negative gravity value −1 to a gravity value of the entry in the parts placement table 205 corresponding to the part number H having the largest placement number 8.

The part gravity value operation unit 203 performs the above described gravity value setting process on connection lines 2 (net2), connection line 3 (net3), connection line 6 (net6), and connection line 7 (net7) corresponding to the repetitive processes in steps 306 through 309 shown in FIG. 3.

Since the same area number is set in each of the entries corresponding to the two part numbers, C, H/D, F at each end for connection line 4 (net4) and connection line 5 (net5) as shown in FIG. 8, the part gravity value operation unit 203 does not accumulate a new gravity value to any of the gravity values of the entries.

As a result of the above described process, the gravity value of each part is updated as shown in FIG. 9B or 8.

Figure 11:
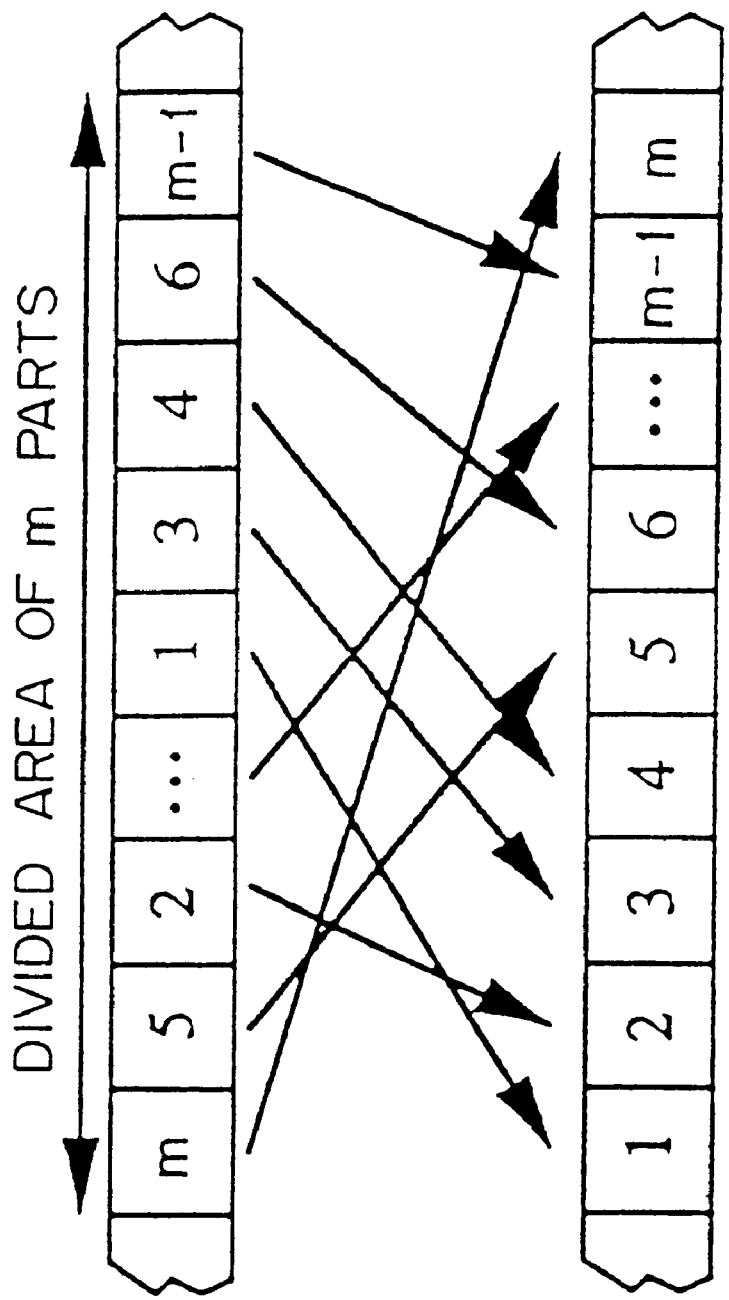
FIG. 11 shows the process of replacement of parts according to the first embodiment of the present invention.

Then, a parts replacement unit 206 shown in FIG. 2 is realized as a function performed by the CPU of a computer by executing a predetermined program stored in a storage device. As shown in FIG. 11, a rearranging process is performed in such a way that entries are arranged from smallest to largest (from left to right in the image shown in FIG. 11) in gravity value including symbols in a divided area for each divided area, that is, for each entry group in which the same area number is set in the parts placement table 205 (step 310 shown in FIG. 3). For this rearranging process, for example, an algorithm such as a quick sort algorithm, a bucket sort algorithm, etc. is adopted.

When a gravity value of each part is set as shown in FIG. 9B or 8, the parts replacement unit 206 performs a rearranging process as shown in FIG. 9B in each of the divided areas 1 and 2.

As a result, the placement status of a part number in the parts placement table 205 changes from the placement status shown in FIG. 8 into the placement status shown in FIG. 12. However, each gravity value and each area number remain unchanged as shown in FIG. 8. The total connection line length ('total' in FIGS. 9A and 9B) of the connection lines 1 through 7 is 33 in the initial status (status 1) shown in FIG. 9A, and is reduced into 23 in the status 2 shown in FIG. 9B.

A repetition control unit 207 shown in FIG. 2 is realized as a function performed by the CPU of a computer by executing a predetermined program stored in the storage device. At the currently set area granularity k, a series of processes (steps 304 through 310 shown in FIG. 3) are repeated s times by the area division unit 201, the part gravity value operation unit 203, and the parts replacement unit 206.

In this case, the repetition control unit 207 instructs the area division unit 201 to reset the number R1 (1≦R1≦m) of parts of the divided area 1 based on a new random number generated by the random number generation unit 202 at the above described area granularity k (step 304 in FIG. 3).

For simple explanation, the number of repetitions s of the process performed by the repetition control unit 207 is set to 2 (actually the process is performed more than 2 times as described later), and the area granularity k is set to 8.0 which is equal to the above described initial value.

The area division unit 201 generates the divided area 1 as follows. That is, the area division unit 201 selects an integer based on a new random number generated by the random number generation unit 202 from among the integers 1 through 8 determined according to the integer portion m=8 of the area granularity k. The integer is assumed to be R1=5. The area division unit 201 selects one real number in the range from 0 to 1.0 based on the random number generated by the random number generation unit 202. If the random number is 0.3, it is larger than the decimal portion h=0.0 of the area granularity k and the area division unit 201 generates the divided area 1 having the size of R1=5. Practically, the area division unit 201 sets to 1 each of the area numbers of the placement numbers 1 through 5 in the parts placement table 205. As a result, the number of parts contained in the remaining area is 3.

Figure 13:
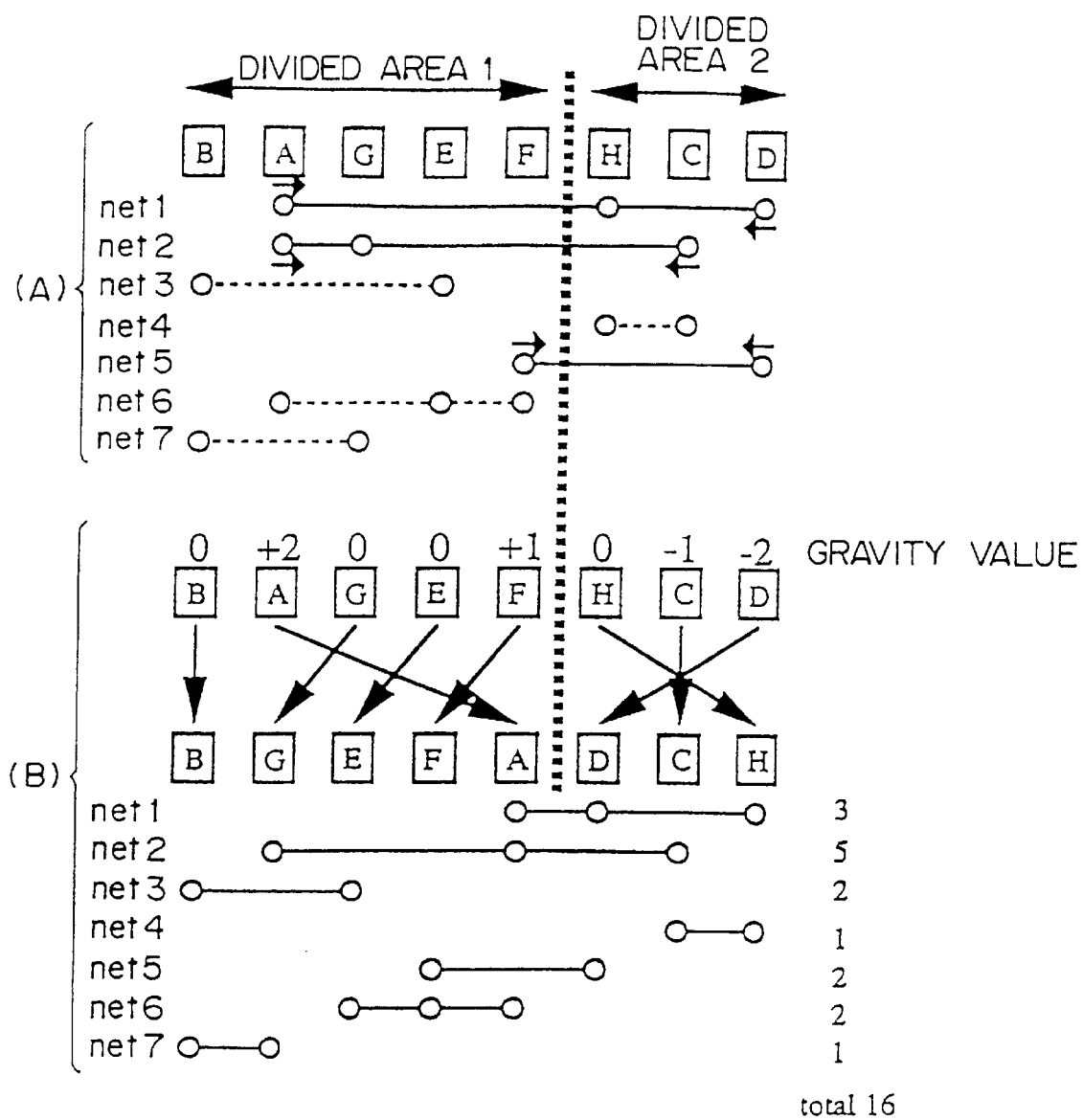
FIG. 13 show a diagram of a status change (2 to 3) of parts placement.

Then, the area division unit 201 generates the divided area 2 as follows. That is, the area division unit 201 selects one real number in the range from 0 through 1.0 based on a random number generated by the random number generation unit 202. Assuming that the selected random number is 0.9, the random number 0.9 is larger than the decimal portion h=0.0 of the area granularity k. Therefore, the area division unit 201 tries to generate a divided area 2 having the integer portion m=8 of the area granularity k. However, the number of remaining parts is 3, and the area division unit 201 generates a divided area 2 having the size of 3 as shown in FIG. 13A. Practically, the area division unit 201 sets each of the area numbers of the placement numbers 6 through 8 to 2 as shown in FIG. 12.

In the status of the parts placement table 205 shown in FIG. 12 and in the status 2 of the image of the parts placement shown in FIG. 9B or 13A, the part gravity value operation unit 203 retrieves from the parts placement table 205 the placement number of each part number in the parts lists A, D, and G for a connection line 1 (net1) in the connection line definition table 204, and extracts the part number A having the smallest placement number 2 and the part number D having the largest placement number 8. Since different area numbers are set in the entries for the two part numbers A and D in the parts placement table 205 as shown in FIG. 12, the part gravity value operation unit 203 accumulates a positive gravity value +1 to a gravity value of the entry in the parts placement table 205 corresponding to the part number A having the smallest placement number 2, and accumulates a negative gravity value −1 to a gravity value of the entry in the parts placement table 205 corresponding to the part number D having the largest placement number 8.

The part gravity value operation unit 203 performs the above described gravity value setting process on connection line 2 (net2) and connection line 5 (net5) corresponding to the repetitive processes in steps 306 through 309 shown in FIG. 3.

Since the same area number is set in each of the entries corresponding to the two part numbers B, E/H, C/A, F/B, G at each end of connection line 3 (net3), connection line 4 (net4), connection line 6 (net6), and connection line 7 (net7) as shown in FIG. 12, the part gravity value operation unit 203 does not accumulate a new gravity value to any of the gravity values of the entries.

As a result of the above described process, the gravity value of each part is updated as shown in FIG. 13B or 12.

When a gravity value of each part is set as shown in FIG. 13B or 12, the parts replacement unit 206 performs a rearranging process as shown in FIG. 13B in each of the divided areas 1 and 2.

As a result, the placement status of a part number in the parts placement table 205 changes from the placement status shown in FIG. 12 into the placement status shown in FIG. 14. However, each gravity value and each area number remain unchanged as shown in FIG. 12. The total connection line length ('total' in FIG. 13B) of the connection lines 1 through 7 is 23 in the status 2 shown in FIG. 9B or 13A, and is reduced into 16 in the status 3 shown in FIG. 13B.

The repetition control unit 207 shown in FIG. 2 performs a series of processes (steps 304 through 310 shown in FIG. 3) s times through the area division unit 201, the part gravity value operation unit 203, and the parts replacement unit 206 at the currently set area granularity k, and then passes control to an area granularity change unit 208 (step 302 shown in FIG. 3).

The area granularity change unit 208 is realized as a function performed by the CPU of a computer by executing a predetermined program stored in the storage device, and reduces by a small amount the previous value of the area granularity k according to the following equation (10) (step 302 shown in FIG. 3).

$$k=k-0.01k/\log_2(k) \tag{10}$$

The equation (10) is based on the following grounds.

Assuming that W parts arranged at equal intervals in a one-dimensional array are delimited and divided based on the area granularity k, the number of divided areas is indicated by the following equation (11). However, it is assumed that the real number k is equivalent to its integer portion m in the following description.

$$j=W/k \tag{11}$$

Since there are k parts constantly in each divided area, the possible number of replacements is obtained by the following equation (12) for each divided area.

$$k! \tag{12}$$

There are j independent divided areas, and therefore the possible number of replacements in the entire area is obtained by the following equation (13).

$$(k!)^{W/k} \tag{13}$$

There can be a method of dividing the entire area into k parts for each probable size of the divided area 1. As described above, the number of parts in the divided area 1 can be 1 through k, and therefore the possible number of replacements in the entire area in consideration of the total k cases can be obtained by the following equation (14) based on the equation (13).

$$k(k!)^{W/k} \tag{14}$$

This is hereinafter referred to as N(k). Assuming that all these possible replacements can be performed in equal probability, the occurrence probability Pi of each possible number of replacements is obtained by the following equation (15).

$$Pi=1/N(k) \tag{15}$$

The entropy S(k) of the amount of information corresponding to the occurrence probability Pi is obtained by the following equation (16).

$$S(k) = \sum_{i=1}^{N(k)} Pi \log_2 Pi = \sum_{i=1}^{N(k)} (1/N(k))\log_2(1/N(k)) \tag{16}$$

$$= \log_2(1/N(k)) = -\log_2(N(k))$$

where the amount of the change in entropy when the area granularity k is changed into h is obtained by the following equation (17).

$$S(k) - S(h) = -\log_2(N(k)) + \log_2(N(h)) \tag{17}$$

$$= \log_2(N(h)/N(k))$$

$$= \log_2(h(h!)^{W/h} k(k!)^{W/k})$$

$$= \log_2(h/k) + \log_2((h!)^{W/h}/(k!)^{W/k})$$

If the area granularity k is changed by a small amount and therefore h/k≈1, then W/h≈W/k and the following equation (18) is expressed. The amount of the change in entropy in the equation (17) is approximated by the following equation (18).

$$S(k) - S(h) \approx (W/k) \log_2 ((h!)^{w/h}/(k!)^{w/k}) \tag{18}$$

Furthermore, when h=k−1, it can be assumed that h=99 and k=100. In this case, the equation (18) is transformed into the following equation (19).

$$S(k) - S(h) = (W/k)\log_2(1/k) \tag{19}$$

$$= -(W/k)\log_2 k$$

If the area granularity k is changed in such a way that the amount of a change in entropy expressed by the equation (19) can be as constant as possible in pace, the amount of a change in the area granularity k can be set to, for example, a value expressed by the following equation (20).

$$0.01 \times k/(\log_2 k) \tag{20}$$

Based on the above described grounds, after the area granularity change unit 208 reduces the previous value of the area granularity k only a small amount by the above described equation (10) (after step 302 shown in FIG. 3), a termination judgment unit 209 shown in FIG. 2 determines whether or not the updated value of the area granularity k has become smaller than 1.0 (step 303 shown in FIG. 3). The termination judgment unit 209 is realized as a function performed by the CPU of a computer by executing a predetermined program stored in the storage device.

If the termination judgment unit 209 determines that the updated value of the area granularity k has not become smaller than 1.0 (NO in the determination in step 303 shown in FIG. 3), then, at a newly set area granularity k, a series of processes (steps 304 through 310 shown in FIG. 3) are repeated s times by the area division unit 201, the part gravity value operation unit 203, the parts replacement unit 206, and the repetition control unit 207.

For simple explanation, it is assumed that the area granularity change unit 208 reduces the value of the area granularity k from the previous initial value 8.0 to a new value 4.8.

Then, the area division unit 201 divides an area. In this case, if the number 8 of parts in the initial status is divided by the new integer portion m=4 of the area granularity k, the result of the division is 2. Therefore, the entire area can be divided into a maximum 3 of divided areas obtained by adding 1 to the division result 2.

First, the area division unit 201 generates the divided area 1 as follows. That is, the area division unit 201 selects an integer based on a new random number generated by the random number generation unit 202 from among the integers 1 through 4 determined according to the integer portion m=4 of the area granularity k. Assuming that the selected integer is R1=1, the area division unit 201 selects a real number in the range from 0 through 1.0 according to the random number generated by the random number generation unit 202. Assuming that the random number is 0.5, the random number 0.5 is smaller than the decimal portion h=0.8 of the area granularity k. Therefore, the area division unit 201 generates the divided area 1 having the size of 2 obtained by adding 1 to R1=1. Practically, the area division unit 201 sets to 1 each of the area numbers of the placement numbers 1 and 2 in the parts placement table 205 as shown in FIG. 14. As a result, the number of parts contained in the remaining areas is 6.

Then, the area division unit 201 generates the divided area 2 as follows. That is, the area division unit 201 selects one real number in the range from 0 to 1.0 according to a random number generated by the random number generation unit 202. Assuming that the random number is 0.9, the random number 0.9 is larger than the decimal portion h=0.8 of the area granularity k. Therefore, the area division unit 201 generates the divided area 2 having the integer portion m=4 of the area granularity k. Practically, the area division unit 201 sets to 2 each of the area numbers of the placement numbers 3 through 6 in the parts placement table 205 as shown in FIG. 14. The number of parts in the remaining area is 2.

Furthermore, the area division unit 201 generates the divided area 3 using the number 2 of the remaining parts as its size. That is, the area division unit 201 sets to 3 each of the area numbers of the placement numbers 7 and 8 in the parts placement table 205 as shown in FIG. 14.

Figure 15:
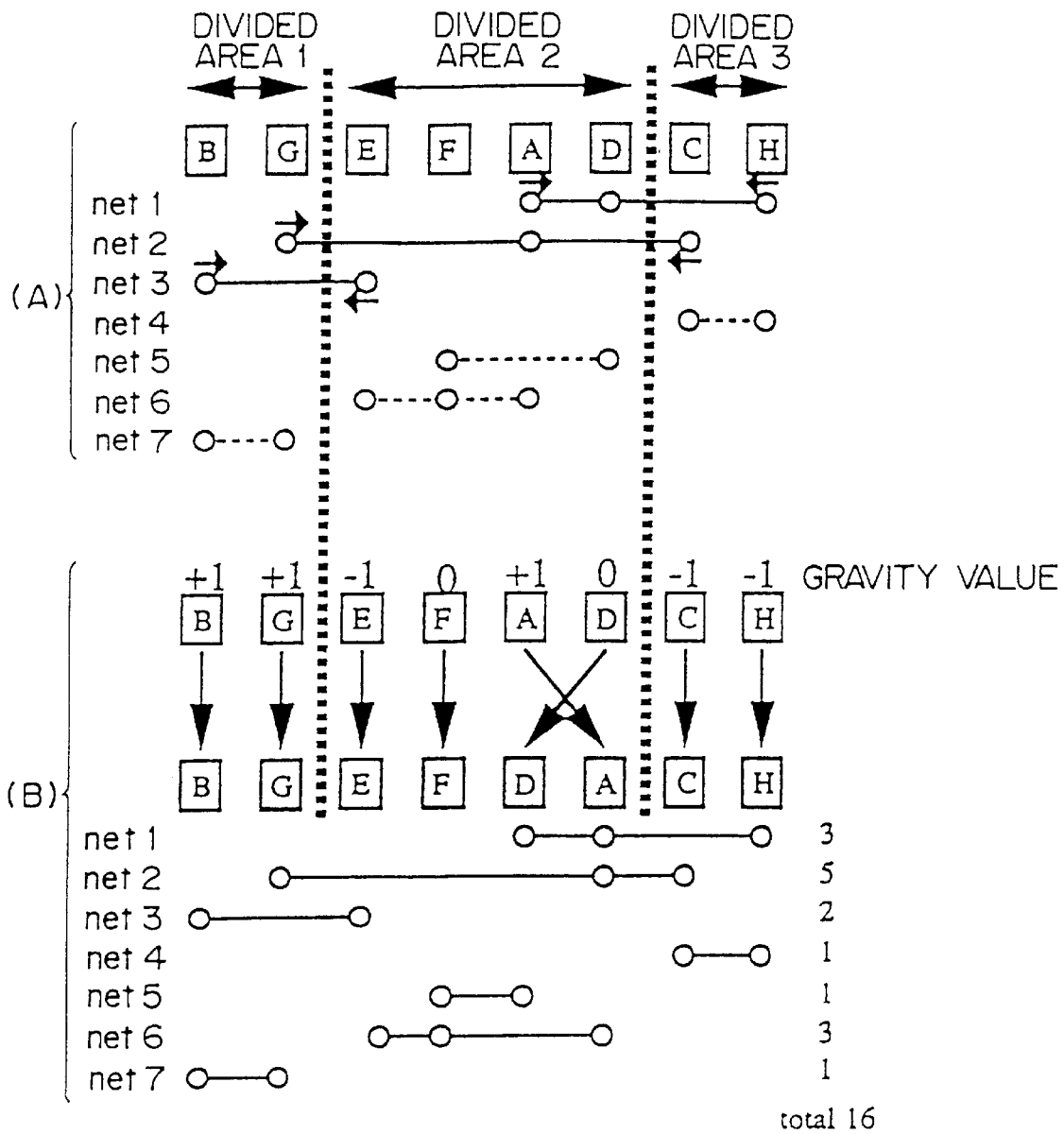
FIG. 15 show a diagram of a status change (3 to 4) of parts placement.

In the status of the parts placement table 205 shown in FIG. 14 and in the status 3 of the image of the parts placement shown in FIG. 13B or 15A, the part gravity value operation unit 203 retrieves from the parts placement table 205 the placement number of each part number in the parts lists A, D, and H for a connection line 1 (net1) in the connection line definition table 204, and extracts the part number H having the smallest placement number 5 and the part number D having the largest placement number 8. Since different area numbers are set in the entries for the two part numbers A and H in the parts placement table 205 as shown in FIG. 14, the part gravity value operation unit 203 accumulates a positive gravity value +1 to a gravity value of the entry in the parts placement table 205 corresponding to the part number A having the smallest placement number 5, and accumulates a negative gravity value −1 to a gravity value of the entry in the parts placement table 205 corresponding to the part number H having the largest placement number 8.

The part gravity value operation unit 203 performs the above described gravity value setting process on connection line 2 (net2) and connection line 3 (net3) corresponding to the repetitive processes in steps 306 through 309 shown in FIG. 3.

Since the same area number is set in each of the entries corresponding to the two part numbers C, H/F, D/E, A/B, G at each end for connection line 4 (net4), connection line 5 (net5), connection line 6 (net6), and connection line 7 (net7) as shown in FIG. 14, the part gravity value operation unit 203 does not accumulate a new gravity value to any of the gravity values of these entries.

As a result of the above described process, the gravity value of each part is updated as shown in FIG. 15B or 14.

When a gravity value of each part is set as shown in FIG. 15B or 14, the parts replacement unit 206 performs a rearranging process as shown in FIG. 15B in each of the divided areas 1, 2, and 3.

As a result, the placement status of a part number in the parts placement table 205 changes from the placement status shown in FIG. 14 into the placement status shown in FIG. 16. However, each gravity value and each area number remain unchanged as shown in FIG. 14. The total connection line length ('total' in FIG. 15B) of the connection lines 1 through 7 remains unchanged, that is, 16, as shown in FIG. 13B or 15A.

Since, as described above, the number of times s the repetition control unit 207 repeats the processes is 2 for simple explanation, the repetition control unit 207 performs a series of processes (steps 304 through 310 shown in FIG. 3) once again through the area division unit 201, the part gravity value operation unit 203, and the parts replacement unit 206 at the currently set area granularity k=4.8.

Figure 17:
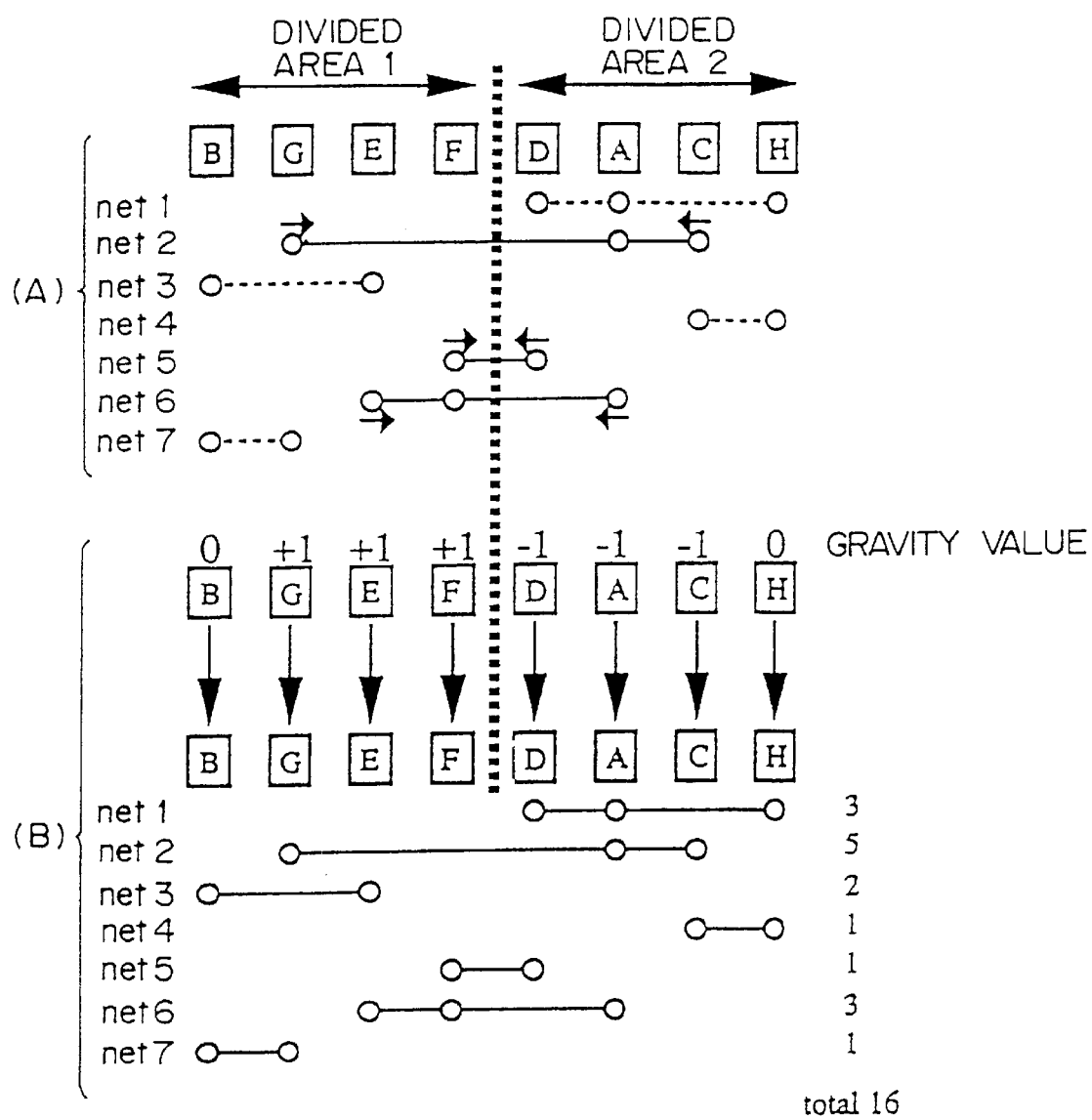
FIG. 17 show a diagram of a status change (4 to 5) of parts placement.

The area division unit 201 generates a divided area 1 as described below. That is, the area division unit 201 selects an integer according to a random number generated by the random number generation unit 202 from the integers 1 through 4 determined by the integer portion m=4.8 of the area granularity k. Assuming that the selected integer is R1=3, the area division unit 201 selects a real number in the range from 0 to 1.0 according to a random number generated by the random number generation unit 202. If the random number is 0.7, it is smaller than the decimal portion h=0.8 of the area granularity k. Therefore, the area division unit 201 generates the divided area 1 having the size 4 obtained by adding 1 to R1=3 as shown in FIG. 17A. Practically, the area division unit 201 sets the area numbers of the placement numbers 1 through 4 in the parts placement table 205 to 1 as shown in FIG. 16. As a result, the number of parts contained in the remaining areas is 4.

The area division unit 201 generates a divided area 2 as follows. That is, the area division unit 201 selects one real number in the range from 0 through 1.0 based on a random number generated by the random number generation unit 202. Assuming that the selected random number is 0.5, the random number 0.5 is smaller than the decimal portion h=0.8 of the area granularity k. Therefore, the area division unit 201 tries to generate a divided area 2 having the value 5 obtained by adding 1 to the integer portion m=4 of the area granularity k. However, the number of remaining parts is 4, and the area division unit 201 generates a divided area 2 having the size of 4 as shown in FIG. 17A. Practically, the area division unit 201 sets each of the area numbers of the placement numbers 5 through 8 to 2 as shown in FIG. 16. As a result, the number of parts in the remaining area is 0.

Since the area division unit 201 cannot generate a divided area any more, control is passed to the part gravity value operation unit 203.

In the status of the parts placement table 205 shown in FIG. 16 and in the status 4 of the image of the parts placement shown in FIG. 15B or 17A, the part gravity value operation unit 203 retrieves from the parts placement table 205 the placement number of each part number in the parts lists A, C, and G for a connection line 2 (net2) in the connection line definition table 204, and extracts the part number G having the smallest placement number 2 and the part number C having the largest placement number 7. Since different area numbers are set in the entries for the two part numbers G and C in the parts placement table 205 as shown in FIG. 16, the part gravity value operation unit 203 accumulates a positive gravity value +1 to a gravity value of the entry in the parts placement table 205 corresponding to the part number G having the smallest placement number 2, and accumulates a negative gravity value −1 to a gravity value of the entry in the parts placement table 205 corresponding to the part number C having the largest placement number 8.

The part gravity value operation unit 203 performs the above described gravity value setting process on connection line 5 (net5) and connection line 6 (net6) corresponding to the repetitive processes in steps 306 through 309 shown in FIG. 3.

Since the same area number is set in each of the entries corresponding to the two part numbers D, H/B, E/C, H/B, G at each end of connection line 1 (net1), connection line 3 (net3), connection line 4 (net4), and connection line 7 (net7) as shown in FIG. 16, the part gravity value operation unit 203 does not accumulate a new gravity value to any of the gravity values of these entries.

As a result of the above described process, the gravity value of each part is updated as shown in FIG. 17B or 16.

When a gravity value of each part is set as shown in FIG. 17B or 16, the parts replacement unit 206 performs a rearranging process as shown in FIG. 17B in each of the divided areas 1 and 2. In this case, no rearranging processes are required.

As a result, the placement status of a part number in the parts placement table 205 changes from the placement status shown in FIG. 16 into the placement status shown in FIG. 18. However, each gravity value and each area number remain unchanged as shown in FIG. 16. The total connection line length ('total' in FIG. 17B) of the connection lines 1 through 7 remains unchanged, that is, 16, as shown in FIG. 15B or 17A.

The above described series of processes are repeatedly performed. Listed below are important values and related drawings.

First Process Based on the Area Granularity k=2.8

The area granularity change unit 208 updates the value of the area granularity k from 4.8 to 2.8.
integer portion m=2 of area granularity k
decimal portion h=0.8 of area granularity k
(number of parts 8)÷(integer portion 2 of area granularity k)=4. Therefore, the entire area can be divided into at maximum 5 divided areas obtained by adding 1 to the division result 4.

Figure 19:
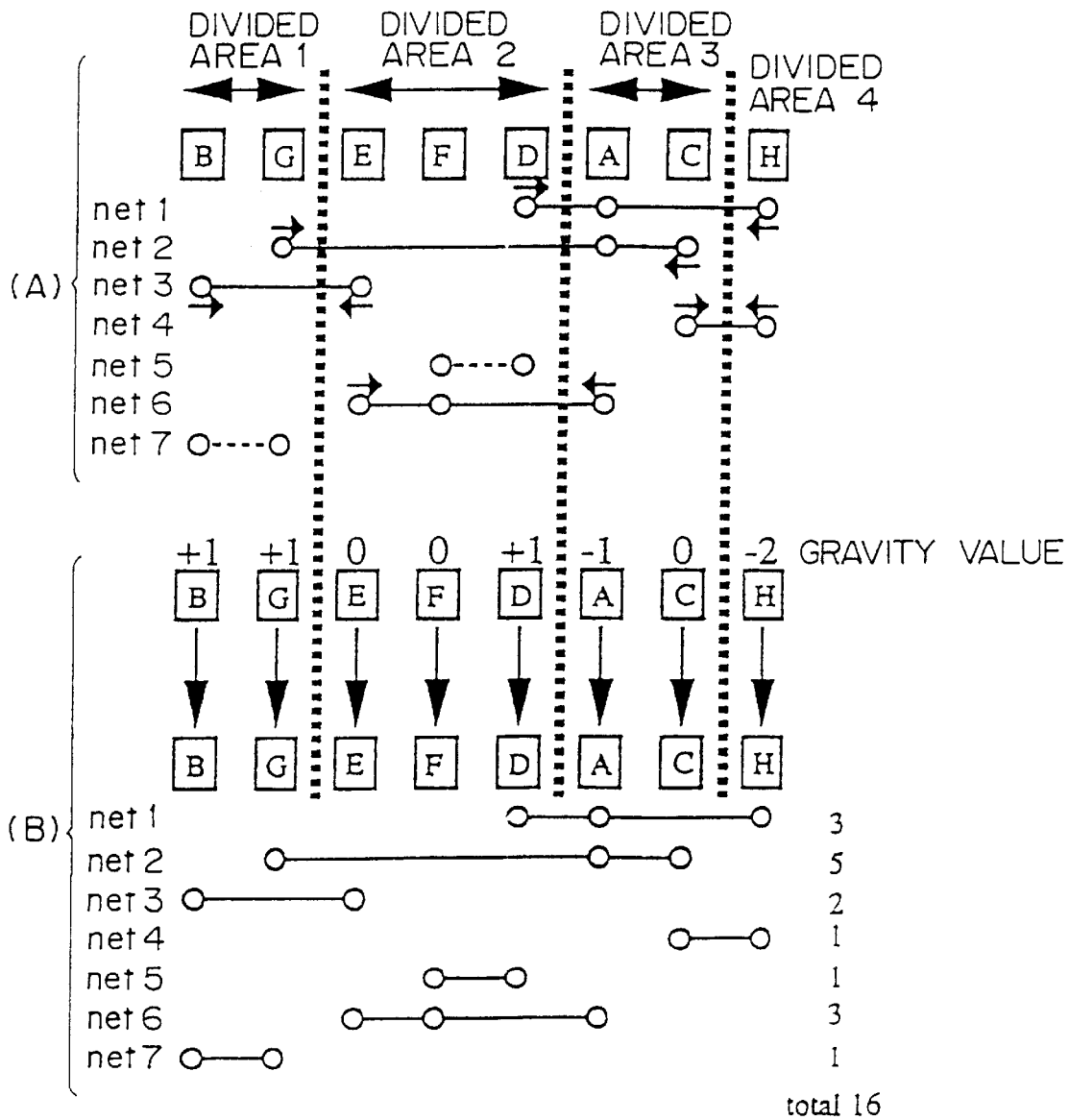
FIG. 19 show a diagram of a status change (5 to 6) of parts placement.

The area division unit 201 generates the divided areas 1 through 4 (FIGS. 18 and 19A).
When the divided area 1 is generated;
R1=1
selected random number=0.1<h=0.8
Therefore, the size of the divided area 1=R1+1=2
number of remaining parts=6
When the divided area 2 is generated;
selected random number=0.6<h=0.8
Therefore, the size of the divided area 2=m+1=3
number of remaining parts=3
When the divided area 3 is generated;
selected random number=0.9>h=0.8
Therefore, the size of the divided area 3=m=2
number of remaining parts=1
When the divided area 4 is generated; size of the divided area 4=number of remaining parts=1
When the divided area 5 is generated;
number of remaining parts=0
Therefore, the divided area 5 cannot be generated.

The part gravity value operation unit 203 computes the gravity value shown in FIG. 18 or 19B.

The parts replacement unit 206 rearranges parts shown in FIG. 19A→FIG. 19B, or FIG. 18→FIG. 20 for each divided area.

Total connection line length of connection lines 1 through 7 ('total' shown in FIG. 19B)=16 which is the value obtained in FIG. 17B or FIG. 19B.

Second Process Based on the Area Granularity k=2.8

Figure 21:
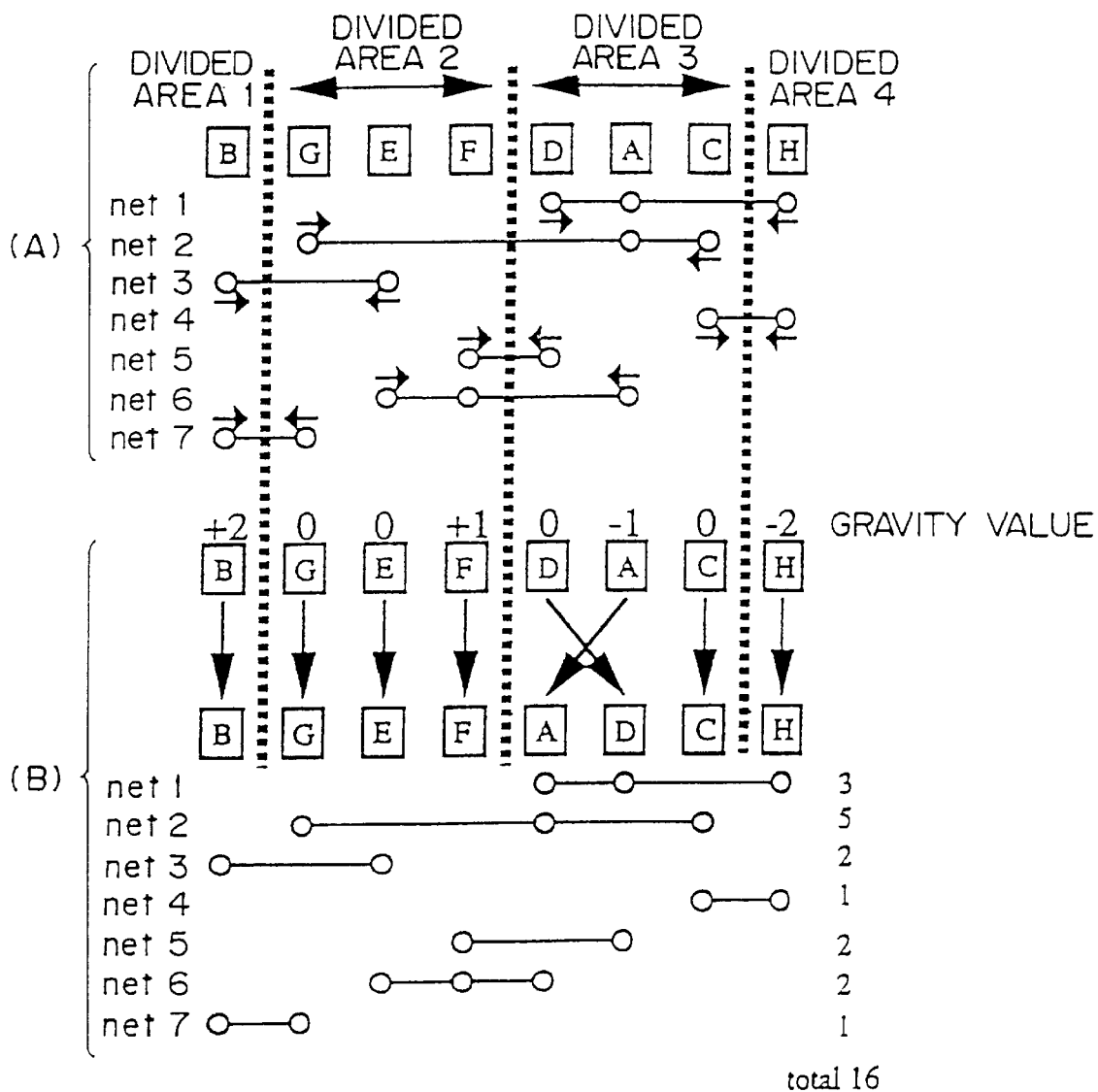
FIG. 21 show a diagram of a status change (6 to 7) of parts placement.

The area division unit 201 generates the divided areas 1 through 4 (FIGS. 20 and 21A).
When the divided area 1 is generated;
R1=1
selected random number=0.9>h=0.8
Therefore, the size of the divided area 1=R1=1
number of remaining parts=7
When the divided area 2 is generated;
selected random number=0.6<h=0.8
Therefore, the size of the divided area 2=m+1=3
number of remaining parts=4
When the divided area 3 is generated;
selected random number=0.3 <h=0.8
Therefore, the size of the divided area 3=m+1=3 number of remaining parts=1
When the divided area 4 is generated;
size of the divided area 4=number of remaining parts=1
When the divided area 5 is generated;
number of remaining parts=0
Therefore, the divided area 5 cannot be generated.

The part gravity value operation unit 203 computes the gravity value shown in FIG. 20 or 21B.

The parts replacement unit 206 rearranges parts shown in FIG. 21A→FIG. 21B, or FIG. 20→FIG. 22 for each divided area.

Total connection line length of connection lines 1 through 7 ('total' shown in FIG. 21B)=16 which is the value obtained in FIG. 19B or FIG. 21B.

First Process Based on the Area Granularity k=1.6

The area granularity change unit 208 updates the value of the area granularity k from 2.8 to 1.6.
integer portion m=1 of area granularity k
decimal portion h=0.6 of area granularity k
(number of parts 8)÷(integer portion 1 of area granularity k)=8. Therefore, the entire area can be divided into at maximum 9 divided areas obtained by adding 1 to the division result 8.

Figure 23:
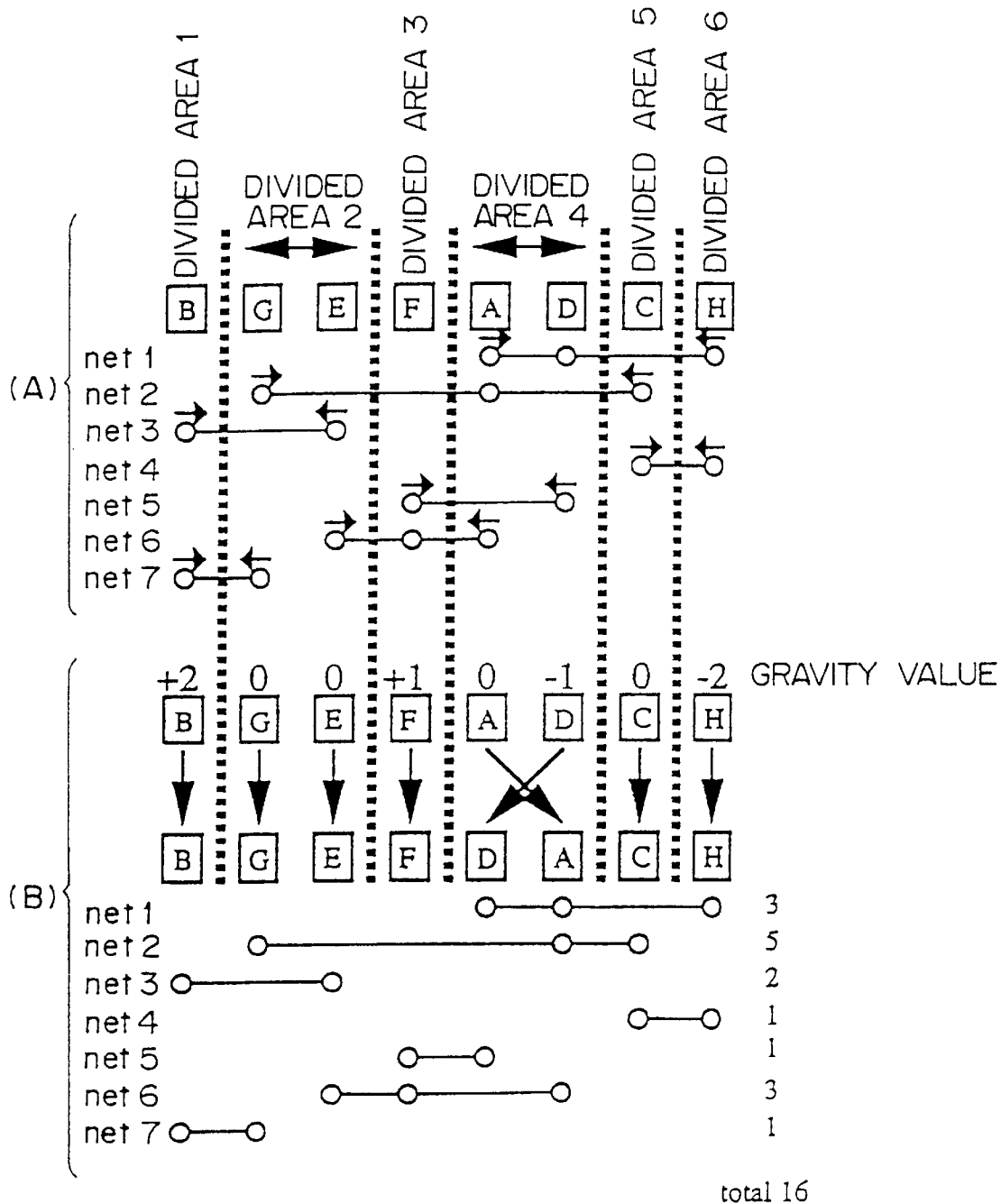
FIG. 23 show a diagram of a status change (7 to 8) of parts placement.

The area division unit 201 generates the divided areas 1 through 6 (FIGS. 22 and 23A).
When the divided area 1 is generated;
R1=1 (only possible value)
selected random number=0.8>h=0.6
Therefore, the size of the divided area 1=R1=1
number of remaining parts=7
When the divided area 2 is generated;
selected random number=0.3<h=0.6
Therefore, the size of the divided area 2=m+1=2
number of remaining parts=5
When the divided area 3 is generated;
selected random number=0.7>h=0.6
Therefore, the size of the divided area 3=m=1
number of remaining parts=4
When the divided area 4 is generated;
selected random number=0.1<h=0.6
Therefore, the size of the divided area 4=m+1=2
number of remaining parts=2
When the divided area 5 is generated;
selected random number=0.9>h=0.6
Therefore, the size of the divided area 5=m=1
number of remaining parts=1
When the divided area 6 is generated;
size of the divided area 6=number of remaining parts=1
When the divided areas 7, 8, and 9 are generated;
Since the number of remaining parts is 0, and the divided areas 7, 8, and 9 are not generated.

The part gravity value operation unit 203 computes the gravity value shown in FIG. 22 or 23B.

The parts replacement unit 206 rearranges parts shown in FIG. 23A→FIG. 23B, or FIG. 22→FIG. 24 for each divided area.

Total connection line length of connection lines 1 through 7 ('total' shown in FIG. 23B)=16 which is the value obtained in FIG. 21B or FIG. 23B.

Second Process Based on the Area Granularity k=1.6

Figure 25:
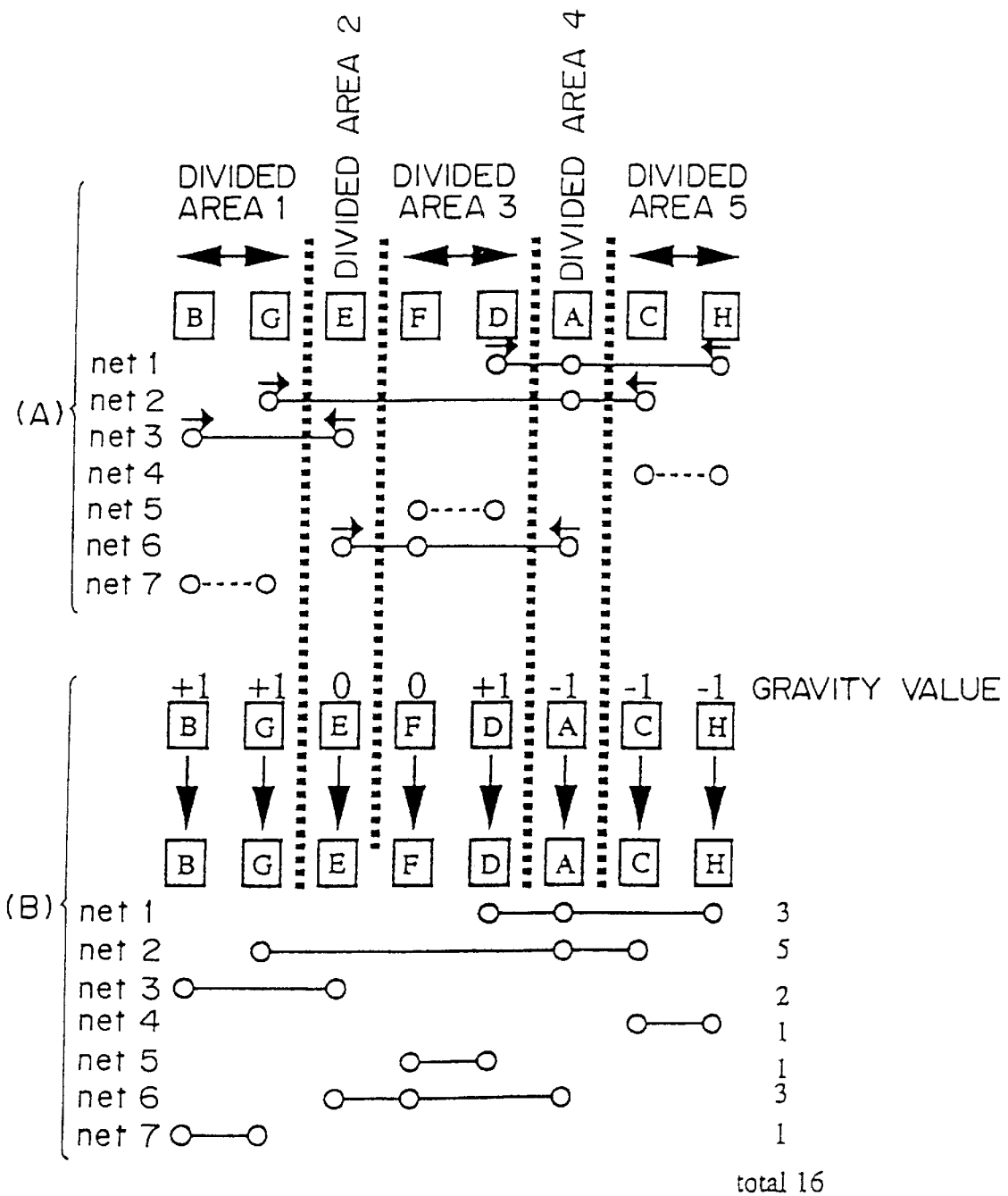
FIG. 25 show a diagram of a status change (8 to 9) of parts placement.

The area division unit 201 generates the divided areas 1 through 5 (FIGS. 24 and 25A).
When the divided area 1 is generated;
R1=1 (only possible value) selected random number= 0.3<h=0.6

Therefore, the size of the divided area 1=R1+1=2
number of remaining parts=6
When the divided area 2 is generated;
selected random number=0.7>h=0.6
Therefore, the size of the divided area 2=m=1
number of remaining parts=5
When the divided area 3 is generated;
selected random number=0.3<h=0.8
Therefore, the size of the divided area 3=m+1=2
number of remaining parts=3
When the divided area 4 is generated;
selected random number=0.8>h=0.6
Therefore, the size of the divided area 4=m=1
number of remaining parts=2
When the divided area 5 is generated;
selected random number=0.1<h=0.6
Therefore, the size of the divided area 5=m+1=2
number of remaining parts=0
When the divided areas 6, 7, 8, and 9 are generated;

Since the number of remaining parts is 0, and the divided areas 6. 7, 8, and 9 are not generated.

The part gravity value operation unit 203 computes the gravity value shown in FIG. 24 or 25B.

The parts replacement unit 206 rearranges parts shown in FIG. 24A→FIG. 25B, or FIG. 24→FIG. 26 for each divided area.

Total connection line length of connection lines 1 through 7 ('total' shown in FIG. 25B)=16 which is the value obtained in FIG. 23B or FIG. 25B.

As a result of repeating the above listed series of processes, the termination judgment unit 209 shown in FIG. 2 determines the termination of the repetitive processes when the area granularity change unit 208 updates the area granularity k from 1.6 to a value smaller than 1 (YES in step 303 shown in FIG. 3). Then, the position of a part finally obtained by the parts placement table 205 is output as an output result. In the example above, the parts B, G, E, F, D, A, C, and H" of the part numbers in the parts placement table 205 shown in FIG. 26, are output as output results.

FIG. 27 shows the relationship among the number of rearranging processes, the area granularity k, and the total connection line length in FIGS. 7 through 9, and 12 through 26.

Figure 28:
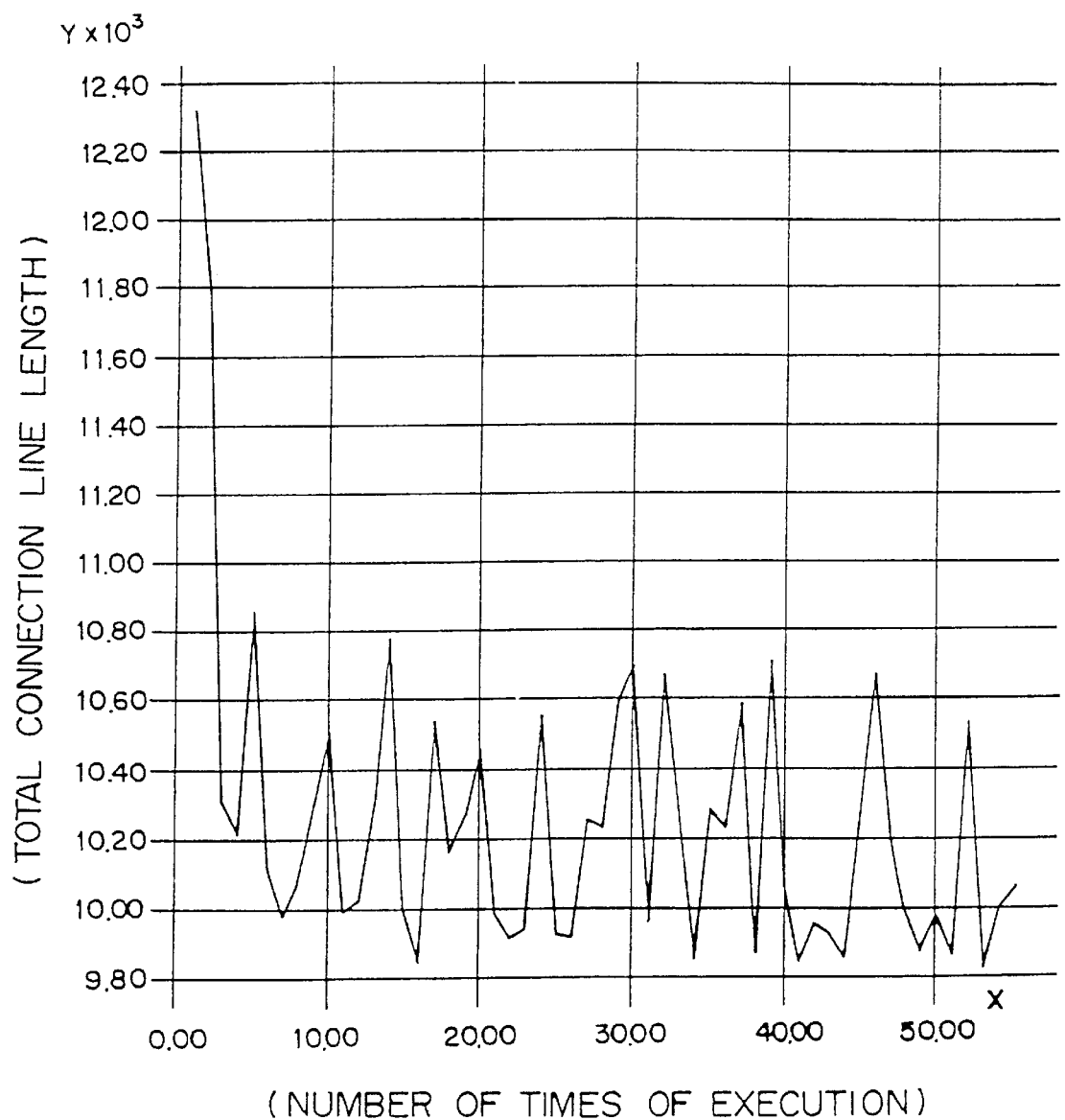
FIG. 28 shows the relationship between the number s of rearranging operations and the total connection line length according to the first embodiment of the present invention.

Result of Comparison Between the First Embodiment of the Present Invention and the Related Art FIG. 28 shows a graph obtained by computing on a predetermined sample part string the relationship between the number s (refer to FIG. 3) of the rearranging processes for each value of the area granularity k according to the first embodiment of the present invention and the total connection line length.

As shown in FIG. 28, according to the first embodiment of the present invention, the total connection line length can be converged into a predetermined minimal range by repeating the area dividing process about 10 times while determining the size of the divided area 1 using a random number with the same area granularity k. This proves that the first embodiment of the present invention realizes a considerably higher-speed process.

Figure 29:
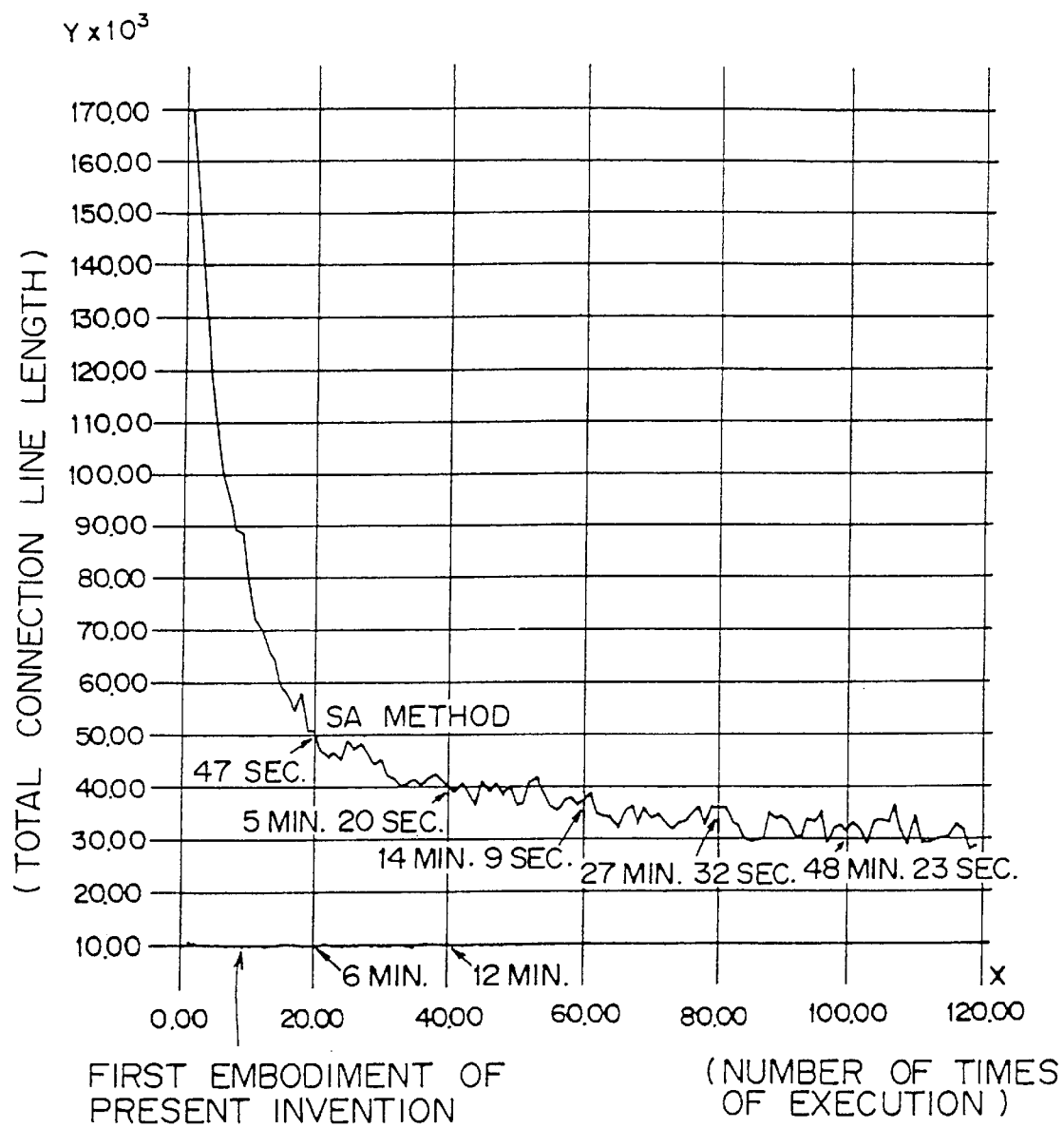
FIG. 29 shows the comparison between the first embodiment of the present invention and the conventional SA method by checking the relationship between the number s of rearranging operations and the total connection line length.

FIG. 29 shows the comparison between a graph obtained by computing on a predetermined sample part string the relationship between the number s (refer to FIG. 3) of the rearranging processes for each value of the area granularity k according to the first embodiment of the present invention and the total connection line length, and a graph obtained by computing on the same sample part string the relationship between the number of the exchanging processes for each value at a temperature T in the conventional SA method and the total connection line length. FIG. 29 also shows an operation time required for each process performance.

Since the SA method is followed by switching two parts for replacement as shown in FIG. 29, a solution is slowly improved, thereby requiring a long process time on the whole. The first embodiment according to the present invention is faster in processing speed than the SA method. Additionally, the first embodiment of the present invention has the cost-performance of at least 10 times as much as the SA method.

Figure 30:
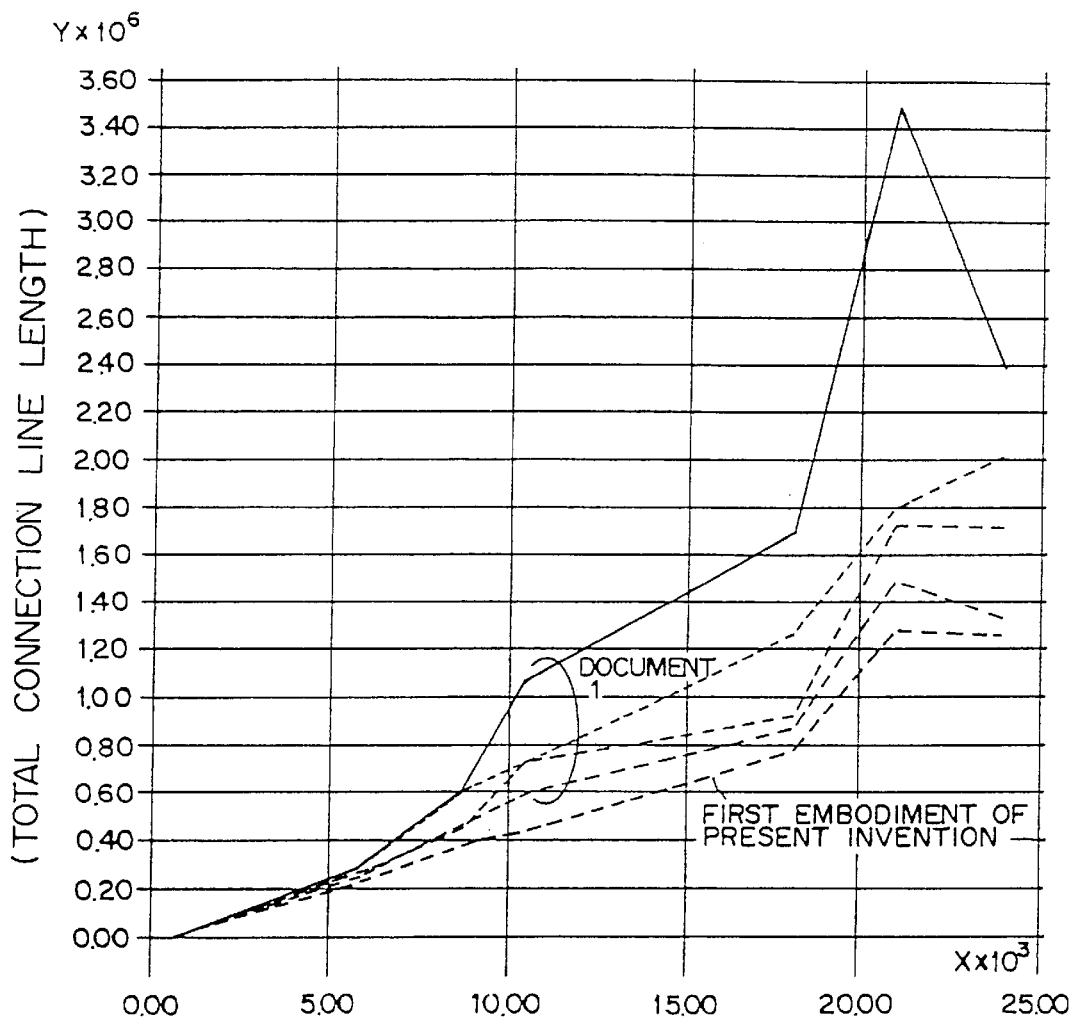
FIG. 30 shows the comparison between the first embodiment of the present invention and the conventional spectral method by checking the relationship between the number of parts (cells) and the total connection line length.

FIG. 30 shows the comparison between the relationship between the number of parts (number of cells) in a predetermined sample part string group and a total connection line length and the conventional spectral method and each reference technology described in the document 'Jianmin Li, John LillisLung-Tien Liu, and Chun-Kuan Cheng, New Spectral Linear Placement and Clustering Approach', 33rd Design Automation Conference 1996.

As shown in FIG. 30, the final total connection line length can converge to a small value for all numbers of parts according to the first embodiment of the present invention when compared with the spectral method.

As described above, the process of repeatedly dividing an area of the same area granularity k with the size of the divided area 1 determined by a random number and the above described repetitive process further performed after reducing the area granularity k by a small amount by the equation (10) after the repetitive processes terminate are sequentially performed according to the first embodiment of the present invention. In each process, the above described gravity value is set and the rearranging process is performed. These are the features of the present invention.

Figure 31:
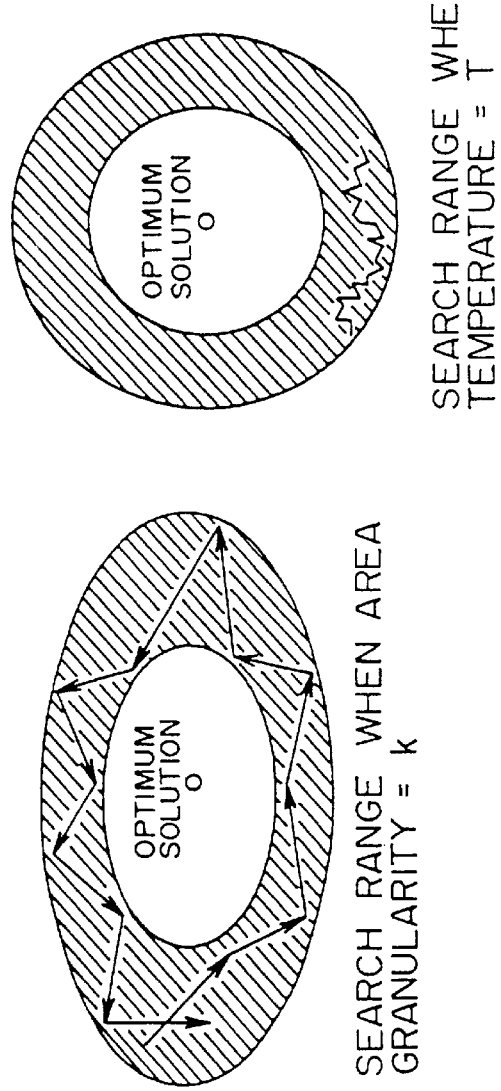
FIGS. 31A, 31B and 31C show the effect of the first embodiment of the present invention.

When the area granularity k is large at the initial stage of the process, parts are rearranged with a rather long connection line length as in the SA method at a high temperature. That is, the rearranging process for each divided area according to the first embodiment of the present invention is performed as a search in a multiple-dimensional solution space in a slightly incorrect manner in a direction in which the total connection line length is reduced. As shown in FIG. 31A, this refers to a process of selecting the direction of a vector indicated by the thin connection line shown in FIG. 31A which indicates almost the best selection on the whole but with a little discrepancy when the vector virtually indicated by the solid connection line is the best selection in the solution A.

Since the value of the area granularity k is gradually reduced as described above according to the first embodiment of the present invention, the direction of the solution is selected in the actual process in such a way that the discrepancy from the best selection for the direction of the solution can be gradually reduced. As described above, a similar concept is adopted in the SA method. In the SA method, the value is reduced with the temperature T as long as the parts are switched with the connection line length increased. Thus, according to the first embodiment of the present invention, it is assumed that the process of automatically escaping (hill climbing method) the local optimization solution is incorporated as in the SA method, and the probability that the local optimization solution is reached can be lowered as compared with the spectral method. This assumption is proved in FIG. 30.

Furthermore, since parts are rearranged in a large range in a single rearranging process according to the first embodiment of the present invention as compared with the SA method, it is assumed that the retrieval range of a solution space is large and the optimum solution can be quickly reached as shown in FIGS. 31A, 31B and 31C. This assumption is proved in FIG. 28 or 29.

As described above, the first embodiment of the present invention is evidently superior to the conventional technology.

Second Embodiment of the Present Invention

A two-dimensional placement of parts is assumed according to the second embodiment of the present invention. That is, it is assumed that parts are arranged in a two-dimensional array as an actual semiconductor integrated circuit.

Figure 32:
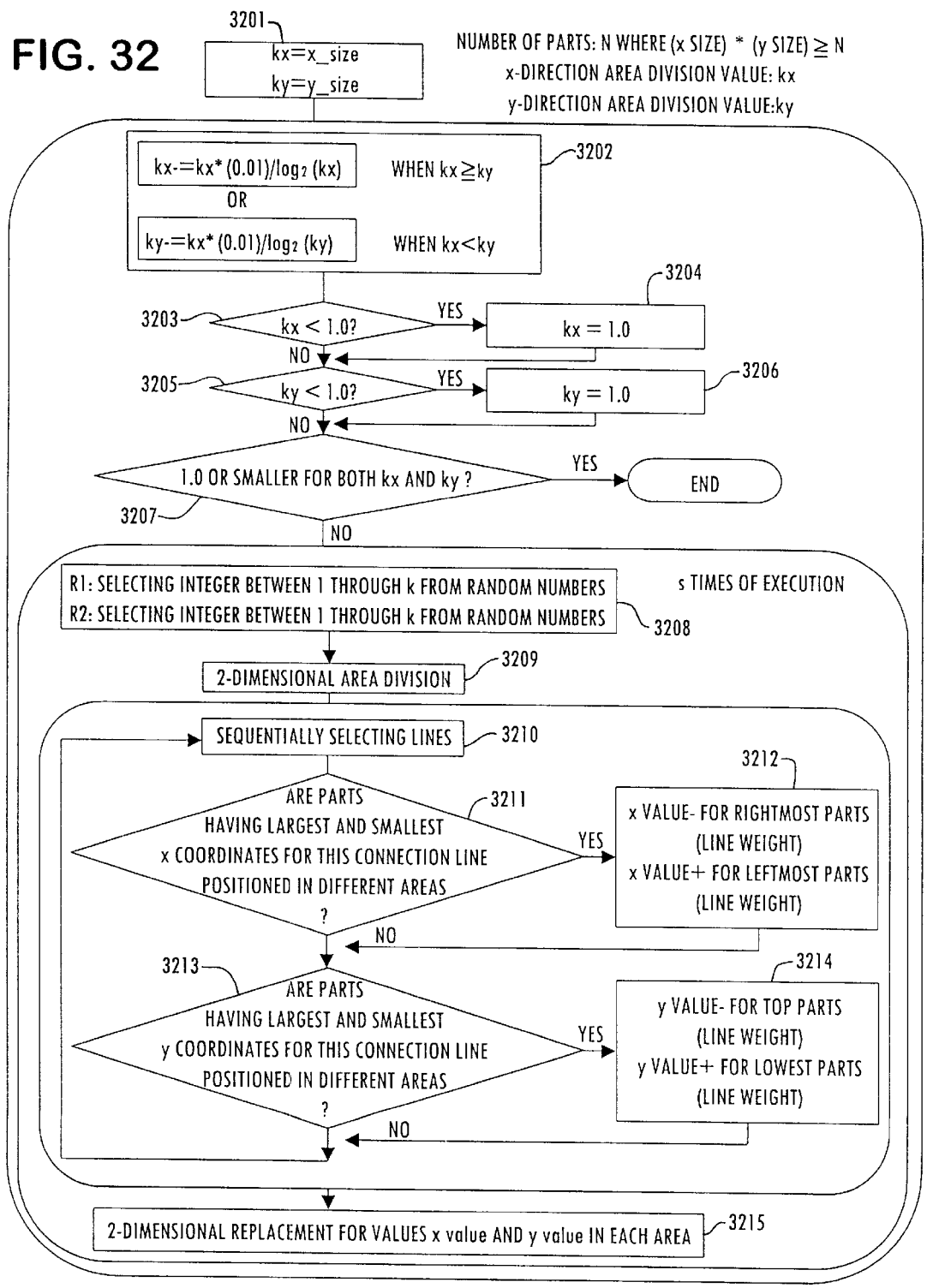
FIG. 32 is a flowchart showing the operation according to the second embodiment of the present invention.

The basic configuration according to the second embodiment of the present invention is similar to the configuration shown in FIG. 2 corresponding to the first embodiment of the present invention. FIG. 32 is a flowchart showing the functions according to the second embodiment of the present invention realized by the configuration shown in FIG. 2.

Figure 33:
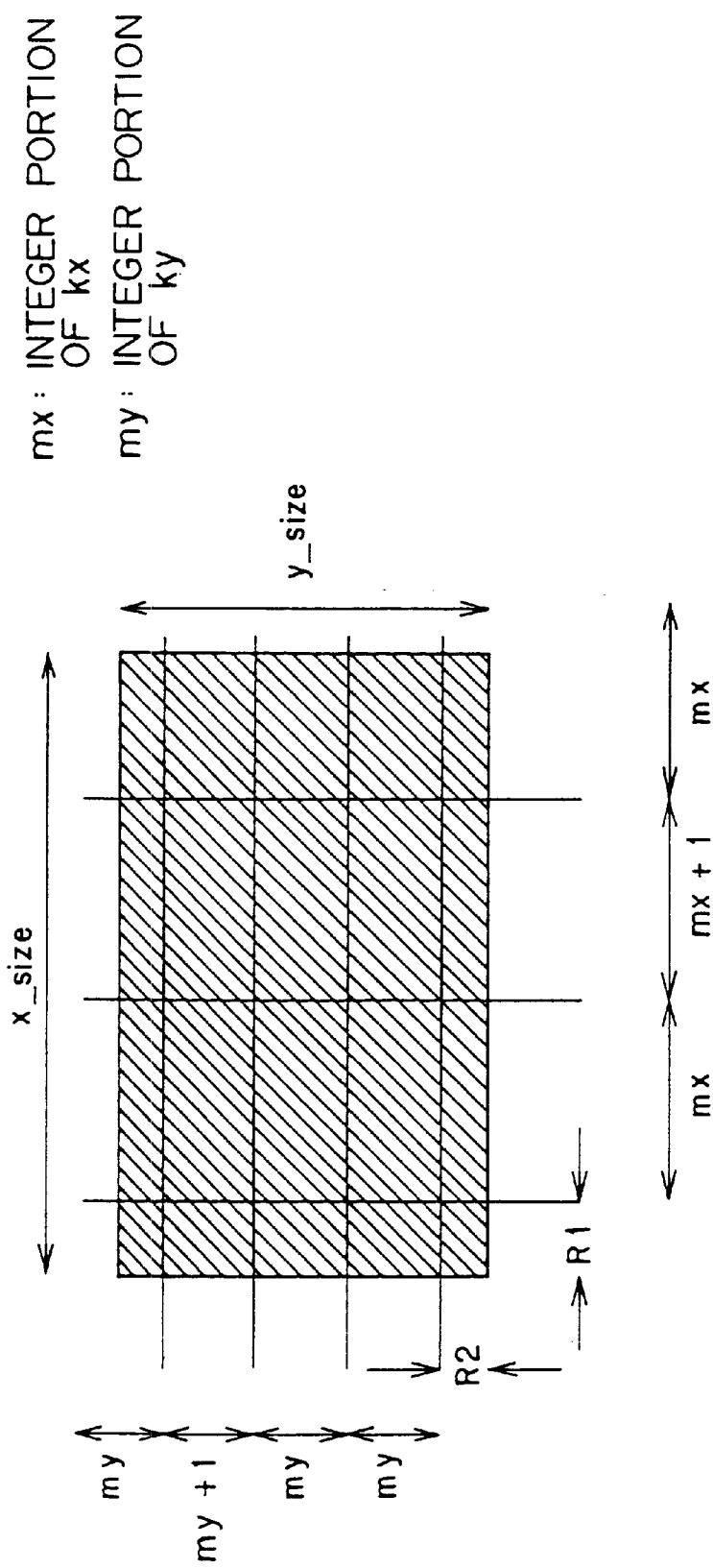
FIG. 33 shows the process of dividing an area according to the second embodiment of the present invention.

First, in FIG. 2, the area division unit 201 performs a two-dimensional area division (step 3209 shown in FIG. 32). That is, the area division unit 201 divides an area in a two-dimensional array (set in step 3201 shown in FIG. 32) having x_size horizontal parts by y_size vertical parts into x or mx+1 horizontal parts by my or my+1 vertical parts as shown in FIG. 33. In this process, mx and my indicate integer portions respectively having the horizontal area granularity kx and the vertical area granularity ky. In this case, as according to the first embodiment of the present invention, there are plural cases of dividing an area into mx and my parts. In each case, the number of portions are set in the horizontal and vertical directions based on the first area (lower left corner portion shown in FIG. 33). Therefore, the area division unit 201 determines the number of horizontally divided parts R1 ($1 \leq R1 < mx$) and the number of vertically divided parts R2 ($1 \leq R2 \leq my$) based on the first area (lower left corner portion shown in FIG. 33 (step 3208 in FIG. 32). These values R1 and R2 are determined based on two random numbers generated by the random number generation unit 202 as according to the first embodiment of the present invention. Since the horizontal area granularity kx and the vertical area granularity ky can be real numbers, areas having the number mx of horizontally divided parts exist with areas having the number mx+1 of horizontally divided parts, and areas having the number my of vertically divided parts exist with areas having the number my+1 of vertically divided parts, at respective values hx and hy of the decimal portions. The area division unit 201 sets an area number corresponding to each area in its entry.

The connection line definition table 204 shown in FIG. 2 according to the second embodiment of the present invention has the configuration shown in FIG. 5 as according to the first embodiment of the present invention.

The parts placement table 205 shown in FIG. 2 according to the second embodiment of the present invention has the configuration shown in FIG. 6 as according to the first embodiment of the present invention. However, according to the second embodiment, the placement number is a two-dimensional value specifying the position of each part in a two-dimensional area as shown in FIG. 33, and is expressed as (x direction placement number, y direction placement number). A smaller x direction placement number indicates a position closer to the leftmost position in the two-dimensional area. A larger x direction placement number indicates a position closer to the rightmost position in the two-dimensional area. A smaller y direction placement number indicates a position closer to the lowest position in the two-dimensional area. A larger y direction placement number indicates a position closer to the highest position in the two-dimensional area.

According to the second embodiment of the present invention, a gravity value also indicates a two-dimensional value, and is expressed as (x direction gravity value, y direction gravity value).

Next, the part gravity value operation unit 203 shown in FIG. 2 retrieves from the parts placement table 205 the x direction placement number of each part number in the parts list corresponding to the connection line number in the connection line definition table 204 for each connection line (step 3210 shown in FIG. 32), extracts a part number having the smallest x direction placement number and two or more parts numbers having the maximum x direction placement number, thereby extracting two parts numbers corresponding to the parts positioned leftmost and rightmost of the connection line. Simultaneously, the part gravity value operation unit 203 retrieves from the parts placement table 205 the y direction placement number of each part number in the parts list corresponding to the connection line number, extracts a part number having the smallest y direction placement number and two or more parts numbers having the maximum y direction placement number, thereby extracting two parts numbers corresponding to the parts at the top and bottom of the connection line.

Then, the part gravity value operation unit 203 accumulates a new gravity value to the gravity value in each entry only when different area numbers are set in respective entries in the parts placement table 205 corresponding to the parts numbers at respective end points (YES in step 3211 or 3213 shown in FIG. 32). In this case, according to the second embodiment of the present invention, the part gravity value operation unit 203 accumulates a positive gravity value to the x direction gravity value of an entry in the parts placement table 205 corresponding to the part number having the smallest x direction placement number, accumulates a negative gravity value to the x direction gravity value of an entry in the parts placement table 205 corresponding to the part number having the largest x direction placement number, accumulates a positive gravity value to the y direction gravity value of an entry in the parts placement table 205 corresponding to the part number having the largest y direction placement number, and accumulates a negative gravity value to the y direction gravity value of an entry in the parts placement table 205 corresponding to the part number having the largest y direction placement number (step 3212 or 3214 in FIG. 32) where x_value indicates an x direction gravity value and y_value indicates a y direction gravity value.

Then, the parts replacement unit 206 shown in FIG. 2 performs a rearranging process in a divided area for each divided area, that is, for each entry group in which the same area number is set, in the parts placement table 205 according to the following algorithm (step 3215 shown in FIG. 32).

Figure 34A:
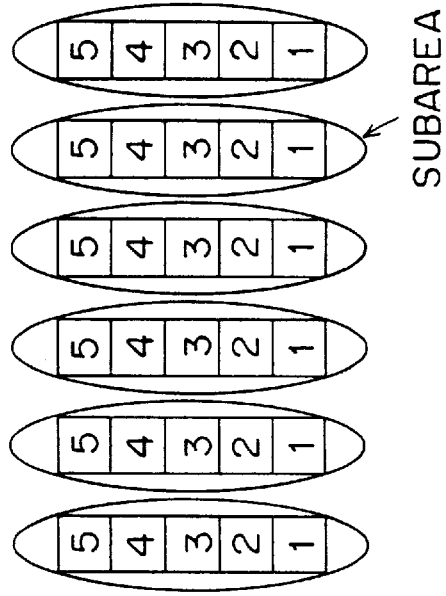
FIGS. 34A and 34B show the process of replacement of parts according to the second embodiment of the present invention.

That is, by referring to the parts placement table 205, the parts replacement unit 206 first arranges parts from smallest to largest in the values (x direction gravity value x_value) which includes signs in an object divided area (entry group) as indicated by step 1 shown in FIG. 34A. The numbers shown in FIG. 34A are arranged from smallest to largest.

Figure 34B:
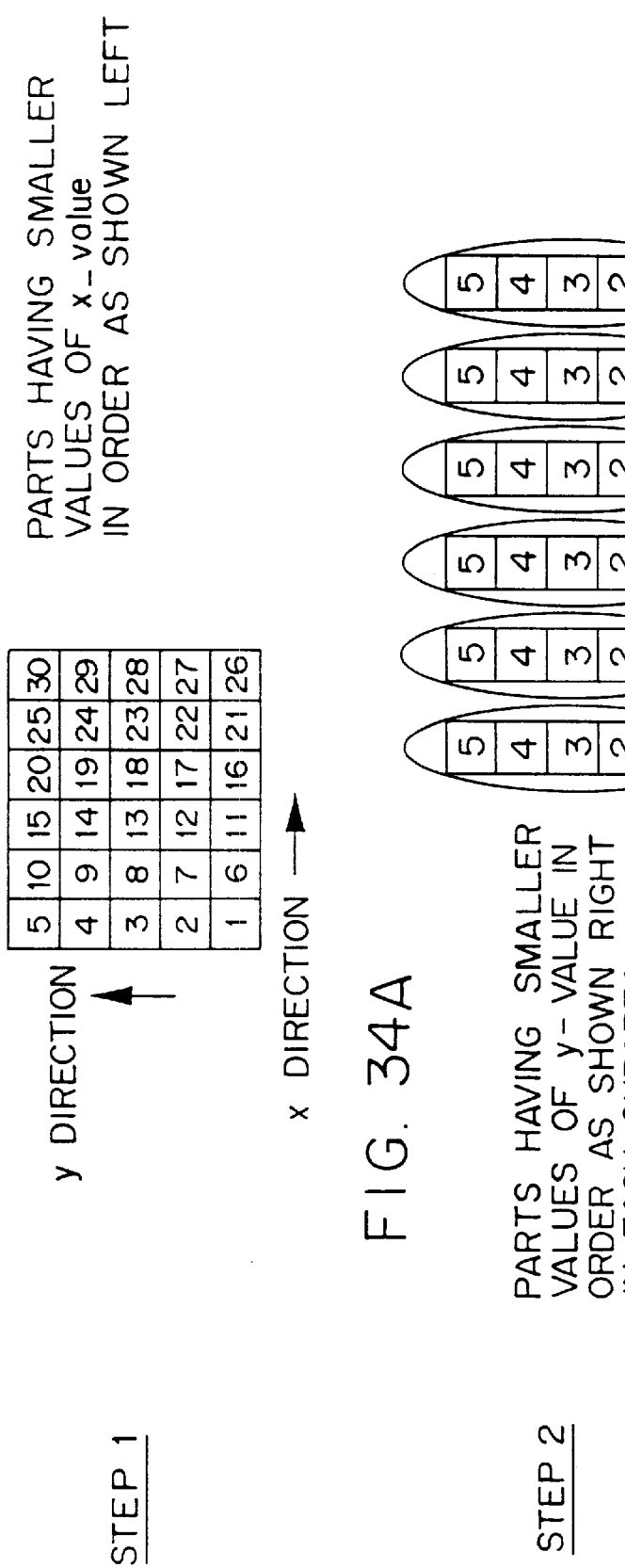

Next, the parts replacement unit 206 arranges parts from smallest to largest in (y direction gravity value y_value) for each subarea in a divided area arranged in step 1 shown in FIG. 34A. The numbers shown in FIG. 34B are arranged from smallest to largest.

After the parts replacement unit 206 has completed the parts rearranging process, the repetition control unit 207 shown in FIG. 2 performs a series of processes (in steps 3208 through 3215 in FIG. 32) s times through the area division unit 201, the part gravity value operation unit 203, and the parts replacement unit 206 at the x-direction area granularity kx and the y-direction area granularity ky.

In this case, the repetition control unit 207 instructs the area division unit 201 to set again the number of parts R1 and R2 at the previous x-direction area granularity kx and y-direction area granularity ky using a new random number generated by the random number generation unit 202 (step 3208 shown in FIG. 32).

After the above described series of processes have been performed s times, the repetition control unit 207 passes control to the area granularity change unit 208 (step 3202 shown in FIG. 32).

The area granularity change unit 208 reduces by a small amount each of the previous x-direction area granularity kx and y-direction area granularity ky as in the above described equation (10) (step 3202 shown in FIG. 32).

Then, the termination judgment unit 209 shown in FIG. 2 determines whether or not both of the updated x-direction area granularity kx and y-direction area granularity ky have become smaller than 1.0 (step 3207 shown in FIG. 32). If only one of them has become smaller than 1.0, it is set to 1.0 (step 3203 to 3204 or 3205 to 3206 shown in FIG. 32).

If the termination judgment unit 209 determines that both of the updated x-direction area granularity kx and y-direction area granularity ky are larger than 1.0 (NO in step 3207 shown in FIG. 32), then a series of processes (step 3208 through 3205 shown in FIG. 32) are performed by the area division unit 201, the part gravity value operation unit 203, the parts replacement unit 206, and the repetition control unit 207 s times at newly set x-direction area granularity kx and y-direction area granularity ky.

If the termination judgment unit 209 determines that both of the x-direction area granularity kx and y-direction area granularity ky have become 1.0 or smaller (YES in step 3207 shown in FIG. 32), then it instructs the parts placement table 205 to output the finally obtained parts placement as an output result.

With the configuration according to the second embodiment of the present invention, the effect according to the first embodiment of the present invention can be realized by actually minimizing the total connection line length of the parts of the semiconductor integrated circuit.

Explanation About the Computer System to Which Each Preferred Embodiment of the Present Invention is Applied The function according to the first embodiment of the present invention realized as shown in the configuration chart in FIG. 2 and shown in the flowchart in FIG. 3, or the function according to the second embodiment of the present invention realized as shown in the configuration chart in FIG. 2 and shown in the flowchart in FIG. 32, can be realized by reading data through a general-purpose computer system as shown in FIG. 35 from the storage medium containing a program for the functions.

In FIG. 35, the program (containing data) for realizing the functions according to the first and second embodiments of the present invention is read by an external storage medium read device 3502 from a storage medium 3501 such as a CD-ROM disk, an optical disk, a removable hard disk, a magnetic tape, a floppy disk, etc., and is then stored in an auxiliary storage device 3508 such as a fixed hard disk device, etc. through a computer bus 3503.

Then, if an operator issues the above described program execution command through a man-machine interface device such as a keyboard 3507, a display device 3506, etc., then a CPU 3505 loads the program for the first or second embodiment of the present invention stored in the auxiliary storage device 3508 to a main storage device 3504, and starts executing the program.

In this case, the templates of the connection line definition table 204 and the parts placement table 205 shown in FIG. 2, 5, or 6, etc. are also loaded to the main storage device 3504 as a part of the program. The operator preliminarily inputs actual connection line definition and parts information through the keyboard 3507 or an input device, etc. not shown in the figures. The information is stored in the connection line definition table 204 and the parts placement table 205.

The above described program stored in the main storage device 3504 and executed by the CPU 3505 is obtained by describing in a predetermined computer language the functions realized by following the flowchart according to the first embodiment of the present invention shown in FIG. 3 or the flowchart according to the second embodiment of the present invention shown in FIG. 32, and then by compiling and linking them.

The output result obtained by executing the above described program (refer to FIG. 2) is displayed on the display device 3506 or printed on a printer device not shown in FIG. 2 or FIG. 35, or is output from an output device, etc. not shown in FIG. 2 or FIG. 35, or connected to a semiconductor design device, etc.

Thus, the present invention can also be realized as a computer-readable storage medium.

Other Preferred Embodiment

The present invention is applied not only to a circuit parts total connection line length minimization problem, but also to a schedule optimization problem in, for example, performing optimal scheduling among a plurality of actions, and to other automatic placement problems.

What is claimed is:

1. A method of placing a plurality of components in a way that a connection cost of the components can be minimized, comprising:

a first process of dividing an area containing the components into a plurality of regular divided areas based on an area granularity;

a second process of extracting a set of the components at each end of each connection;

a third process of changing places of each component in each divided area in a way that the connection cost between the components can be minimized when the components belonging to the set of the components obtained in said second process exist in different divided areas;

a fourth process of repeatedly performing said first through third processes while changing at random a division starting position in said first process without changing an area granularity;

a fifth process of repeatedly performing said first through fourth processes while changing the area granularity in a way that a predetermined initial value can be gradually decreased each time a series of repetition control processes terminates in said fourth process; and a sixth process of outputting a placement of the components as an output result when the series of repetition control process in said fifth process terminates.

2. A method of placing a plurality of parts in a way that a connection line length of the parts can be minimized, comprising:

a first process of dividing an area containing the parts into a plurality of regular divided areas based on an area granularity;

a second process of extracting a set of the parts at each end of each connection line;

a third process of changing places of each part in each divided area in such a way that the connection line length between the parts can be minimized when the parts belonging to the set of the parts obtained in said second process exist in different divided areas;

a fourth process of repeatedly performing said first through third processes while changing at random a division starting position in said first process without changing an area granularity;

a fifth process of repeatedly performing said first through fourth processes while changing the area granularity in a way that a predetermined initial value can be gradually decreased each time a series of repetition control processes terminates in said fourth process; and a sixth process of outputting a placement of the parts as an output result when the series of repetition control process in said fifth process terminates.

3. The method according to claim 2, wherein said third process comprises:

a process of accumulating a gravity value depending on a position of a connection line for each part in each connection line placement corresponding to a set of the parts to which each part belongs when the parts belonging to the set of the parts obtained in said second process exist in different divided areas; and a process of changing in the divided area a position of each part belonging to each divided area depending on the gravity value accumulated corresponding to each part.

4. The method according to claim 2, wherein said third process comprises:

a process of accumulating a gravity value depending on a position of a connection line for each part in each connection line placement corresponding to a set of the parts to which each part belongs when the parts belonging to the set of the parts obtained in said second process exist in different divided areas, and a gravity value corresponding to a weight preliminarily assigned to the connection line; and a process of changing in the divided area a position of each part belonging to each divided area depending on the gravity value accumulated corresponding to each part.

5. A placement apparatus for placing a plurality of parts in a way that a connection line length of the parts can be minimized, comprising:

area division means for dividing an area containing the parts into a plurality of regular divided areas based on an area granularity;

placement change means for extracting a set of the parts at each end of each connection line, and changing places of each part in each divided area in a way that the connection line length between the parts can be minimized when the parts belonging to the set of the parts obtained in said second process exist in different divided areas;

repetition control means for instructing said area division means and said placement change means to repeatedly perform a series of processes while changing at random a division starting position in said area division means without changing an area granularity;

area granularity change control means for instructing said area division means, said placement change means, and said repetition control means to repeatedly perform a series of processes while changing the area granularity in a way that a predetermined initial value can be gradually decreased each time a series of repetition control process terminates in said repetition control means; and result output means for outputting a placement of the parts as an output result when the series of repetition control processes in said area granularity change control means terminates.

6. The apparatus according to claim 5, wherein said placement change means comprises:

part gravity value accumulation means for accumulating a gravity value depending on a position of a connection line for each part in each connection line placement corresponding to a set of the parts to which each part belongs when the parts belonging to the set of the parts exist in different divided areas; and parts replacement means for changing in the divided area a position of each part belonging to each divided area depending on the gravity value accumulated corresponding to each part.

7. The apparatus according to claim 5, wherein said placement change means comprises:

part gravity value accumulation means for accumulating a gravity value depending on a position of a connection line for each part in each connection line placement corresponding to a set of the parts to which each part belongs when the parts belonging to the set of the parts exist in different divided areas, and a gravity value corresponding to a weight preliminarily assigned to the connection line; and parts replacement means for changing in the divided area a position of each part belonging to each divided area depending on the gravity value accumulated corresponding to each part.

8. A computer-readable storage controlling a computer and comprising a process of:

a first function dividing an area containing the components into a plurality of regular divided areas based on an area granularity;

a second function extracting a set of the components at each end of each connection;

a third function changing places of each component in each divided area in a way that the connection cost between the components can be minimized when the components belonging to the set of the components obtained in said second function exist in different divided areas;

a fourth function repeatedly performing said first through third functions while changing at random a division starting position in said first function without changing an area granularity;

a fifth function repeatedly performing said first through fourth functions while changing the area granularity in a way that a predetermined initial value can be gradually decreased each time a series of repetition control processes terminates in said fourth function; and a sixth function outputting a placement of the components as an output result when the series of repetition control processes in said fifth function terminates.

9. A computer-readable storage controlling a computer and comprising a process of:

a first function dividing an area containing the parts into a plurality of regular divided areas based on an area granularity;

a second function extracting a set of the parts at each end of each connection line;

a third function changing places of each part in each divided area in a way that the connection line length between the parts can be minimized when the parts belonging to the set of the parts obtained in said function exist in different divided areas;

a fourth function repeatedly performing said first through third functions dividing, extracting and changing while changing at random a division starting position in said first function without changing an area granularity;

a fifth function repeatedly performing said first through fourth functions while changing the area granularity in a way that a predetermined initial value can be gradually decreased each time a series of repetition control processes terminates in said fourth function; and a sixth function outputting a placement of the parts as an output result when the series of repetition control processes in said fifth function terminates.

10. The storage medium according to claim 9, wherein said third function comprises:

a function of accumulating a gravity value depending on a position of a connection line for each part in each connection line placement corresponding to a set of the parts to which each part belongs when the parts belonging to the set of the parts obtained in said second function exist in different divided areas; and a function of changing in the divided area a position of each part belonging to each divided area depending on the gravity value accumulated corresponding to each part.

11. The storage medium according to claim 9, wherein said third function comprises:

a function of accumulating a gravity value depending on a position of a connection line for each part in each connection line placement corresponding to a set of the parts to which each part belongs when the parts belonging to the set of the parts obtained in said second function exist in different divided areas, and a gravity value corresponding to a weight preliminarily assigned to the connection line; and a function of changing in the divided area a position of each part belonging to each divided area depending on the gravity value accumulated corresponding to each part.

12. A method of placing a plurality of components to minimize a connection cost of the components, comprising:

repositioning the components such that the connection cost between the components is minimized by using an area of granularity to divide an area containing the components into a plurality of divided areas and determining a set of the components at each end of each connection, and changing the placement of the components in each divided area when the terminal components in each set exist in different divided areas; and repeating said repositioning by randomly changing the division starting position while holding the area granularity constant, and then randomly changing the division starting position while gradually decreasing the area granularity.

13. A computer-readable storage controlling a computer and comprising a process of:

repositioning the components such that the connection cost between the components is minimized by using an area of granularity to divide an area containing the components into a plurality of divided areas and determining a set of the components at each end of each connection, and changing the placement of the components in each divided area when the terminal components in each set exist in different divided areas; and repeating said repositioning by randomly changing the division starting position while holding the area granularity constant, and then randomly changing the division starting position while gradually decreasing the area granularity.

* * * * *